US012658242B2

(12) United States Patent
Bak et al.

(10) Patent No.: US 12,658,242 B2
(45) Date of Patent: Jun. 16, 2026

(54) MEMORY DEVICE AND MEMORY CONTROLLER CONFIGURED TO PERFORM RE-TRAINING BASED ON TEMPERATURE INFORMATION AND ELECTRONIC DEVICE INCLUDING THE SAME

(71) Applicant: Samsung Electronics Co., Ltd., Suwon-si (KR)

(72) Inventors: Jungmin Bak, Suwon-si (KR); Junyoung Ko, Suwon-si (KR); Changhwi Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 175 days.

(21) Appl. No.: 18/338,502

(22) Filed: Jun. 21, 2023

(65) Prior Publication Data

US 2024/0079049 A1    Mar. 7, 2024

(30) Foreign Application Priority Data

Sep. 6, 2022    (KR) ......................... 10-2022-0113079
Dec. 13, 2022    (KR) ......................... 10-2022-0174116

(51) Int. Cl.
G11C 11/4093        (2006.01)
G11C 7/22        (2006.01)
        (Continued)

(52) U.S. Cl.
CPC ............ G11C 11/4093 (2013.01); G11C 8/18 (2013.01); G11C 11/4074 (2013.01);
        (Continued)

(58) Field of Classification Search
CPC ... G11C 11/4093; G11C 8/18; G11C 11/4074; G11C 13/0061; G11C 16/32;
        (Continued)

(56) References Cited

U.S. PATENT DOCUMENTS 7,508,246 B2    3/2009    Kase et al.
7,924,637 B2    4/2011    Searles et al.
        (Continued)

FOREIGN PATENT DOCUMENTS

KR    10-2018-0007366 A    1/2018
KR    10-2022-0033398 A    3/2022

OTHER PUBLICATIONS

Cho et al. "A Sub-1.0V 20nm 5Gb/s/pin Post-LPDDR3 I/O interface with Low Voltage-Swing Terminated Logic and Adaptive Calibration Scheme For Mobile Application," 2013 Symposium on VLSI Circuits Digest of Technical Papers, IEEE (Jun. 2013).
        (Continued)

*Primary Examiner* — Donald H B Braswell
(74) *Attorney, Agent, or Firm* — Wolf, Greenfield & Sacks, P.C.

(57)        ABSTRACT

An electronic device includes a system on-chip that outputs a write clock and a write data signal, and a memory device that receives the write data signal based on the write clock and outputs a read data signal and a data strobe signal whose frequency is different from a frequency of the write clock. The memory device further includes a first interval oscillator, a second interval oscillator, and a temperature sensor. The electronic device performs a first training in initialization of the electronic device and performs a second training in an operation after the initialization. The memory device performs a counting operation during an operation of an interval oscillator in the second training and corrects a final count value with reference to temperature information of the memory device.

10 Claims, 21 Drawing Sheets

(51) Int. Cl.
    *G11C 8/18*        (2006.01)
    *G11C 11/4074*    (2006.01)
    *G11C 13/00*      (2006.01)
    *G11C 16/32*      (2006.01)

(52) U.S. Cl.
    CPC .......... *G11C 13/0061* (2013.01); *G11C 16/32*
        (2013.01); *G11C 7/222* (2013.01); *G11C*
                                *2207/229* (2013.01)

(58) Field of Classification Search
    CPC ..... G11C 7/222; G11C 2207/229; G11C 7/04;
                        G11C 7/1093; G11C 2207/2254
    See application file for complete search history.

(56)                References Cited

U.S. PATENT DOCUMENTS

| | | | |
|---|---|---|---|
| 9,767,868 B2 | 9/2017 | Srinivas et al. | |
| 9,947,377 B2 | 4/2018 | Srinivas et al. | |
| 11,017,839 B2 | 5/2021 | Hsieh et al. | |
| 11,152,040 B1 | 10/2021 | Akamatsu | |
| 11,190,194 B2 | 11/2021 | Wicpalek et al. | |
| 12,051,481 B1* | 7/2024 | Lin ...................... | G11C 7/1093 |
| 2018/0061462 A1* | 3/2018 | Murakami ........... | G11C 7/1063 |
| 2019/0187929 A1 | 6/2019 | Srivastava et al. | |
| 2021/0390991 A1 | 12/2021 | Kumar et al. | |
| 2022/0199132 A1* | 6/2022 | Partsch ................ | G11C 29/023 |
| 2023/0141595 A1* | 5/2023 | Willey ............... | G11C 11/4076 |
| | | | 711/167 |

OTHER PUBLICATIONS

Kim et al. "A 16Gb 9.5Gb/s/pin LPDDR5X SDRAM with Low-Power Schemes Exploiting Dynamic Voltage-Frequency Scaling and Offset-Calibrated Readout Sense Amplifiers in a Fourth Generation 10nm DRAM Process," 2022 IEEE International Solid-State Circuits Conference, vol. 65 (Feb. 2022).

Oh et al. "A 3.2 Gbps/pin 8 Gbit 1.0 V LPDDR4 Sdram With Integrated ECC Engine for Sub-1 V DRAM Core Operation," IEEE Journal of Solid-State Circuits 50(1):178-190 (Jan. 2015).

Song et al. "A 1.1 V 2y-nm 4.35 GB/s/pin 8 GB LPDDR4 Mobile Device With Bandwidth Improvement Techniques," IEEE Journal of Solid-State Circuits 50(8), pp. 1945-1959 (Aug. 2015).

Zheng et al., "Design and Implementation of DDR4 SDRAM Controller Based on FPGA," 2018 2nd IEEE Advanced Information Management, Communicates, Electronic and Automation Control Conference (May 2018).

* cited by examiner

| Temperature Range | Correction Factor |
|---|---|
| T0~T1 | a |
| T1~T2 | b |
| T2~T3 | c |
| ⋮ | ⋮ |
| Tn-1~Tn | n |

MEMORY DEVICE AND MEMORY CONTROLLER CONFIGURED TO PERFORM RE-TRAINING BASED ON TEMPERATURE INFORMATION AND ELECTRONIC DEVICE INCLUDING THE SAME

CROSS-REFERENCE TO RELATED APPLICATIONS

This application claims priority under 35 U.S.C. § 119 to Korean Patent Application Nos. 10-2022-0113079 filed on Sep. 6, 2022, and 10-2022-0174116 filed on Dec. 13, 2022, in the Korean Intellectual Property Office, the disclosures of which are incorporated by reference herein in their entireties.

BACKGROUND

Embodiments of the present disclosure described herein relate to a memory device and a memory controller and an electronic device including the memory device and the memory controller, and more particularly, relate to a technology for executing re-training with reference to temperature information of a memory device.

With the recent trend of high-performance and high-capacity memory devices such as a dynamic random access memory (DRAM), an operating frequency of the memory device is rapidly increasing. In addition, as a mobile device requires a low-power characteristic, a standard for differentiating a frequency of a write clock WCK required for a write operation and a read data strobe signal RDQS required for a read operation has been adopted.

As the operating speed of the memory device increases, it becomes increasingly difficult to correct data integrity of the memory device. Accordingly, the training of the memory device may be required not only during the initialization of the memory device, but also during the operation of the memory device.

Meanwhile, the fine training using the FIFO (First In First Out) is generally executed in the initialization of the memory device, and the coarse and rapid interval oscillator training may be used during the operation of the memory device. However, an error (i.e., an offset) inevitably exists between the delay time (e.g., tWCK2DQI and tWCK2DQO) measured during the FIFO training and the delay time measured during the interval oscillator training, and the error may change depending on a temperature change. However, when the interval oscillator training is performed without applying a change in the offset due to the temperature change, the reliability of the memory device may decrease.

SUMMARY

Embodiments of the present disclosure provide a method for correcting a delay time measured in interval oscillator training with reference to temperature information of a memory device such that an offset between a delay time measured in FIFO training and the delay time measured in the interval oscillator training does not exceed a reference value.

According to an embodiment, an electronic device includes a system on-chip that outputs a write clock and a write data signal, and a memory device that receives the write data signal based on the write clock and outputs a read data signal and a data strobe signal whose frequency is different from a frequency of the write clock. The memory device includes a first interval oscillator that replicates a difference between a path of the write clock and a path of the read data signal, and a second interval oscillator that replicates a difference between the path of the write clock and a path of the write data signal. The system on-chip obtains a first delay time according to the difference between the path of the write clock and the path of the read data signal, and obtains a second delay time according to the difference between the path of the write clock and the path of the write data signal. The memory device obtains a first counting value, indicative of the first delay time, while the first interval oscillator operates. The memory device obtains a second counting value, indicative of the second delay time, while the second interval oscillator operates. The memory device corrects the first counting value depending on a range in which a temperature of the memory device belongs to obtain a corrected first counting value, and corrects the second counting value depending on the range in which the temperature belongs to obtain a corrected second counting value.

According to an embodiment, a memory device which communicates with a memory controller includes a command and address receiver that obtains a FIFO (First In First Out) read command, a FIFO write command, an interval oscillator start command, and an interval oscillator stop command based on a clock and a command and address signal received from the memory controller, a buffer that stores read data which is based on the FIFO read command or write data which is based on the FIFO write command, an interval oscillator that operates during a time interval between an input of the interval oscillator start command and an input of the interval oscillator stop command, a counter that performs counting during the time interval in which the oscillator operates, a control logic circuit that obtains a counting value from the counter when the interval oscillator stops operating and corrects the counting value as a function of a temperature of the memory device to obtain a corrected counting value, and a mode register that stores the corrected counting value.

According to an embodiment, an operating method of an electronic device which includes a memory controller and a memory device includes performing first training by aligning a data strobe signal and/or a data signal based on an input and/or an output of data to/from the memory device, receiving, at the memory device, an oscillator start command, driving an interval oscillator of the memory device in response to the oscillator start command, performing, at a counter of the memory device, counting while the interval oscillator is driven, receiving, at the memory device, an oscillator stop command, obtaining a counting value from the counter when the driving of the interval oscillator is stopped depending on the oscillator stop command, and correcting the counting value depending on a range in which a temperature of the memory device belongs to obtain a corrected counting value.

BRIEF DESCRIPTION OF THE FIGURES

The above and other objects and features of the present disclosure will become apparent by describing in detail embodiments thereof with reference to the accompanying drawings.

FIG. 7 is a timing diagram of signals between a SoC and a memory device in execution of FIFO write training.

FIG. 9 is a circuit diagram illustrating another example of an interval oscillator of FIG. 4.

DETAILED DESCRIPTION

Below, embodiments of the present disclosure will be described in detail and clearly to such an extent that an ordinary one in the art easily implements the invention.

In the detailed description, components described with reference to the terms "unit", "module", "block", "~er or ~or", etc. and function blocks illustrated in drawings will be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
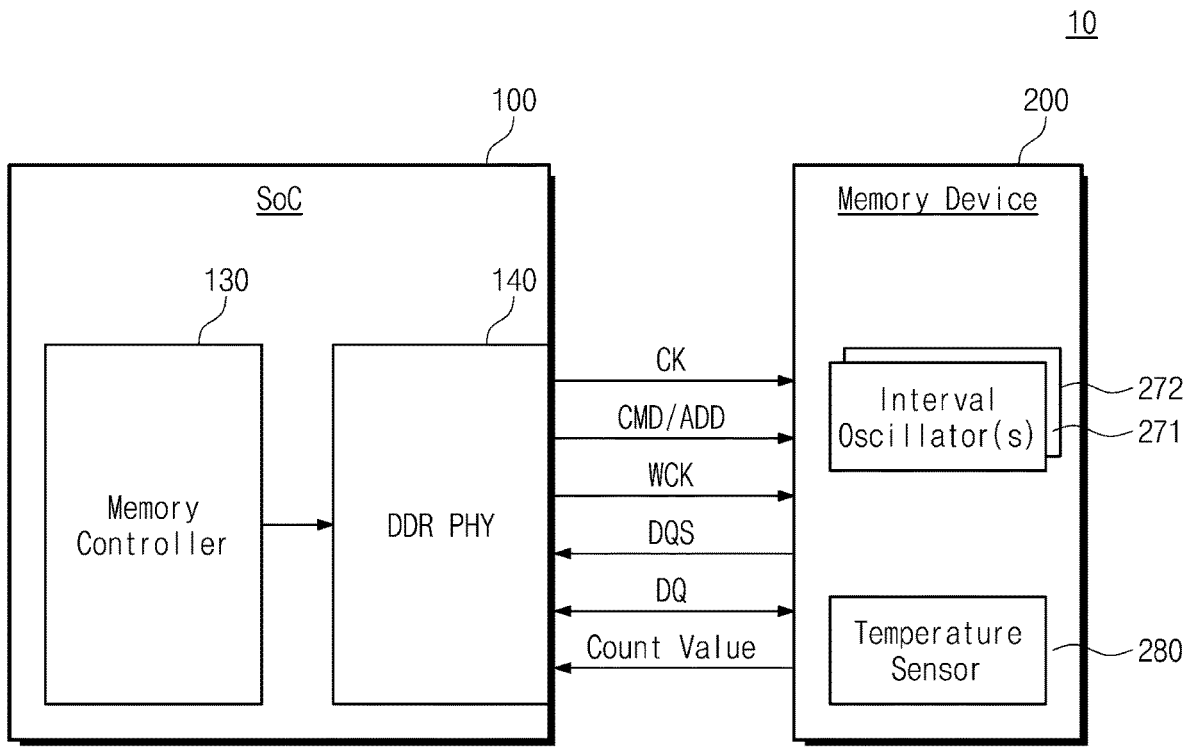
FIG. 1 is a diagram illustrating a configuration of an electronic device according to an embodiment of the present disclosure.

FIG. 1 illustrates an exemplary configuration of an electronic device 10 according to an embodiment of the present disclosure. The electronic device 10 may include a system on-chip (hereinafter referred to as a "SoC") 100 and a memory device 200. For example, the electronic device 10 may be a mobile device such as a smartphone, a desktop computer, a laptop computer, a workstation, a server, etc.

The SoC 100 that is an application processor (AP) may control an overall operation of the electronic device 10. The SoC 100 may execute a program based on an application that the electronic device 10 supports; the SoC 100 may receive data associated with program execution from the memory device 200 or may transmit a result of the program execution to the memory device 200. The SoC 100 may include various intellectual properties (IPs). For example, the SoC 100 may include a memory controller 130 and a double data rate physical layer (hereinafter referred to as a "DDR PHY") 140. In the embodiment of FIG. 1, the memory controller 130 and the DDR PHY 140 are illustrated to be independent of each other, but it may be understood that the DDR PHY 140 may be implemented as a part of the memory controller 130.

The memory controller 130 may control the memory device 200 through the DDR PHY 140. The memory controller 130 may generate signals for accessing the memory device 200. The memory controller 130 may generate data to be stored in the memory device 200. The memory controller 130 may receive the data read from the memory device 200.

The DDR PHY 140 may transmit a clock CK and a command and address signal CMD/ADD to the memory device 200 under control of the memory controller 130. The DDR PHY 140 may transmit a write clock WCK and a data signal DQ to the memory device 200 under control of the memory controller 130. The write clock WCK may refer to a signal for transmitting (in detail, for sampling or latching) the data signal DQ to the memory device 200. The DDR PHY 140 may receive a read data strobe signal RDQS (refer to FIG. 3) and the data signal DQ from the memory device 200. The read data strobe signal RDQS may refer to a signal for receiving the data signal DQ from the memory device 200. The memory device 200 may generate the read data strobe signal RDQS based on the write clock WCK received from the DDR PHY 140.

In response to a request of the SoC 100, the memory device 200 may store data or may provide data stored therein to the SoC 100. The memory device 200 may communicate with the SoC 100 through the DDR PHY 140. For example, the memory device 200 may be a dynamic random access memory (DRAM), a static random access memory (SRAM), a thyristor random access memory (TRAM) a resistive random access memory (RRAM), a ferroelectric random access memory (FRAM), a phase change random access memory (PRAM), a magnetic random access memory (MRAM), etc. Below, the description will be given as the memory device 200 is a DRAM device (i.e., a synchronous dynamic random access memory (SDRAM) device) that operates in synchronization with the clock CK output from the SoC 100. In particular, the memory device 200 may be a low power double data rate (LPDDR) SDRAM.

The memory device 200 may receive the clock CK and the command and address signal CMD/ADD from the SoC 100. The memory device 200 may obtain a command CMD and an address ADD by sampling the command and address signal CMD/ADD based on the clock CK. The memory device 200 may receive the data signal DQ by using the write clock WCK and may output the data signal DQ by using the read data strobe signal RDQS.

The frequency of the write clock WCK may be higher than the frequency of the clock CK. For example, the frequency of the write clock WCK may be an integer multiple of the frequency of the clock CK. The SoC 100 may transmit the clock CK having a relatively low frequency to the memory device 200 and may transmit the write clock WCK having a relatively high frequency to the memory device 200 only during the data input/output.

In an embodiment, in the initialization (e.g., booting-on) of the electronic device 10, the SoC 100 may perform training (hereinafter referred to as "FIFO training") by performing the write operation and the read operation on the memory device 200. Because the FIFO training is performed by using an actual path of write data and read data, the FIFO training may provide high accuracy; however, because the FIFO training accompanies the input/output of data, the FIFO training may not be efficient.

In an embodiment, in a normal operation after the electronic device 10 is initialized, the SoC 100 may perform training (hereinafter referred to as "interval oscillator training") by using interval oscillators 271 and 272 in the memory device 200. For example, the interval oscillator training may be performed periodically, non-periodically, in a temperature change of the memory device 200, or in a voltage change of the memory device 200.

In an embodiment, the interval oscillator 271 may be implemented to replicate a path difference of the write clock WCK and a read data signal (hereinafter referred to as a "read DQ"), and the interval oscillator 272 may be implemented to replicate a path difference of the write clock WCK and a write data signal (hereinafter referred to as a "write DQ"). For example, the interval oscillators 271 and 272 may operate during a specific period (e.g., a runtime) based on the command from the SoC 100, and counting values may increase during the runtime. Final counting values at a point in time when the interval oscillator training ends may correspond to a skew value of the read data strobe signal RDQS to be adjusted and/or a skew value of the data signal DQ to be adjusted. The SoC 100 may correct the skew of the read data strobe signal RDQS and/or the data signal DQ based on the counting values received from the memory device 200.

Meanwhile, because the interval oscillator training is performed indirectly by using the interval oscillators 271 and 272, the interval oscillator training may be efficient; in contrast, the interval oscillator training may not be accurate compared to the FIFO training. That is, an offset or an error may be present between the delay measured through the FIFO training and the delay measured through the interval oscillator training, and the offset may change depending on a temperature. When a result (i.e., a counting value) of the interval oscillator training obtained without offset correction is utilized in the training, the accuracy of the interval oscillator training may decrease. However, the electronic device 10 corrects a counting value based on a range to which a temperature obtained by a temperature sensor 280 belongs, and corrects the skew of the read data strobe signal RDQS and/or the data signal DQ by using the corrected counting value. Accordingly, the accuracy of the interval oscillator training may increase.

Figure 2:
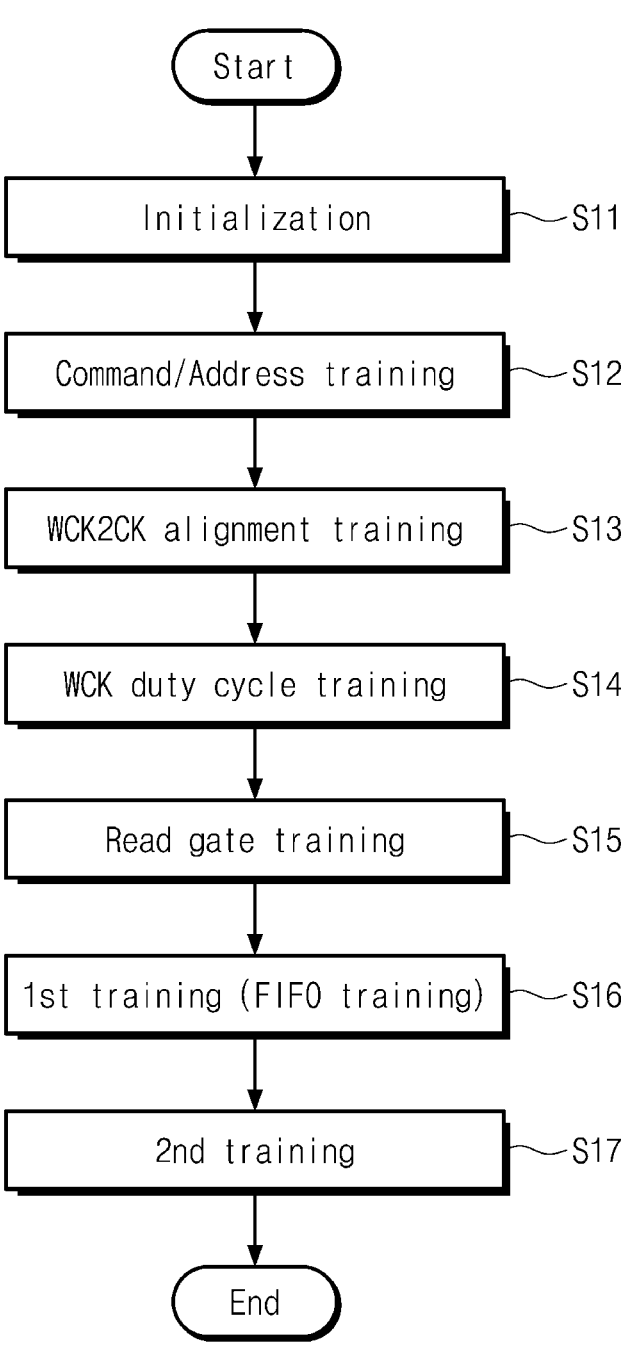
FIG. 2 is a flowchart illustrating an operating method of an electronic device according to an embodiment of the present disclosure.

FIG. 2 is a flowchart illustrating an operating method of an electronic device according to an embodiment of the present disclosure.

Referring to FIGS. 1 and 2, in operation S11, the electronic device 10 may perform initialization. For example, when the electronic device 10 is powered on, the SoC 100 and the memory device 200 may perform initialization in compliance with a given manner. During the initialization, the SoC 100 may provide a power supply voltage to the memory device 200, may perform various initial setup operations, and may read or set necessary information from or to the memory device 200.

In operation S12, the electronic device 10 may perform a command/address training operation. For example, the SoC 100 and the memory device 200 may perform the command/address training operation such that the command CMD and the address ADD are capable of being latched at a desired timing based on the clock CK.

In operation S13, the electronic device 10 may perform a write clock-to-clock (WCK2CK) alignment training operation. For example, the memory device 200 may receive the clock CK and the write clock WCK from the SoC 100 and may adjust the timing to transmit the write clock WCK such that the clock CK and the write clock WCK are aligned. For example, the frequency of the write clock WCK may be "N" times the frequency (N being a natural number) of the clock CK.

In operation S14, the electronic device 10 may perform a WCK duty cycle training operation. For example, the WCK duty cycle training operation may be performed by a duty cycle corrector (DCC) and/or a duty cycle adjuster (DCA) of the DDR PHY 140. For example, the DDR PHY 140 may delay the read data strobe signal RDQS received from the memory device 200 by using a component such as gate logic.

In operation S15, the electronic device 10 may perform a read gate training operation. For example, the memory controller 130 may determine the timing to observe the read DQ and the read data strobe signal RDQS and may control the timing to receive the read DQ and the read data strobe signal RDQS from the memory device 200. To this end, the SoC 100 may include a component (e.g., a logic gate or a delay circuit) for controlling the timing to receive the read data strobe signal RDQS.

In operation S16, the electronic device 10 may perform first training (i.e., FIFO training). For example, due to a design (structure) of the memory device 200 and/or a design (structure) of a package including the memory controller 130, the DDR PHY 140, and the memory device 200, the delay of the data signal DQ may be shorter than the delay of the write clock WCK. The FIFO training may be for correcting the delay due to a path difference of the write clock WCK and the data signal DQ. The FIFO training may include read FIFO training and/or write FIFO training, such as, for example, by aligning a data strobe signal and/or a data signal based on an input or an output of data to/from the memory device 200.

In an embodiment, in the read FIFO training, the SoC 100 may control the timing to receive the read DQ and/or the read data strobe signal RDQS by delaying the read DQ and/or the read data strobe signal RDQS received from the memory device 200. In the write FIFO training, the SoC 100 may control the timing to transmit the write DQ and the write clock WCK by delaying the write DQ to be transmitted to the memory device 200. After the first training is completed, the electronic device 10 may perform a normal operation.

In operation S17, during the normal operation of the electronic device 10, the electronic device 10 may perform second training (i.e., interval oscillator training). The electronic device 10 may increase, for example, a counting value while the interval oscillators 271 and 272 operate; after the operation of the interval oscillators 271 and 272 ends, a final counting value may be corrected based on a temperature obtained by the temperature sensor 280. The corrected counting value may be used to adjust the skew of the data signal DQ and/or the read data strobe signal RDQS.

Figure 3:
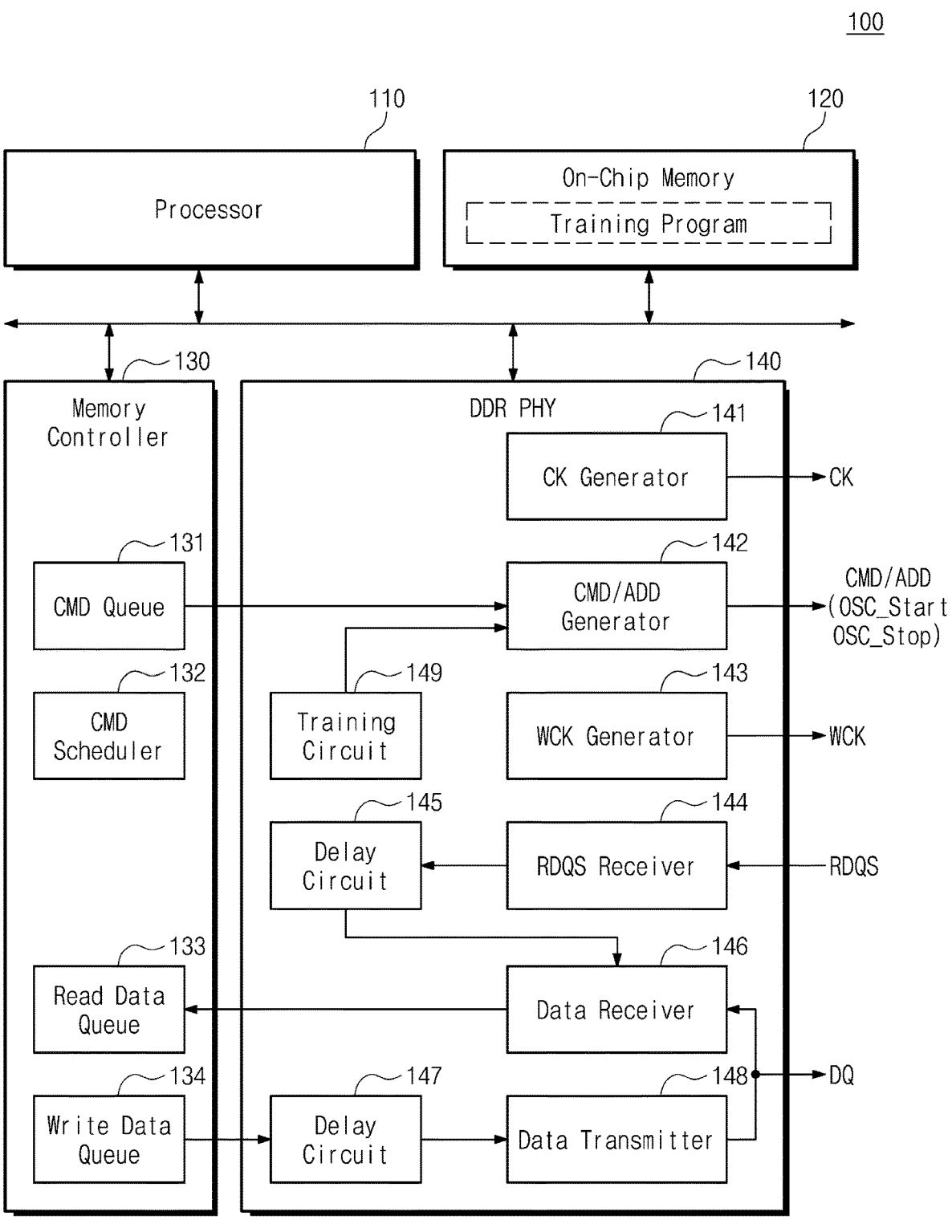
FIG. 3 is a diagram illustrating a configuration of a SoC of FIG. 1.

FIG. 3 is a diagram illustrating a configuration of a SoC of FIG. 1. The SoC 100 may include a processor 110, an on-chip memory 120, the memory controller 130, and the DDR PHY 140.

The processor 110 may execute various software (e.g., an application program, an operating system, a file system, and a device driver) loaded to the on-chip memory 120. The processor 110 may execute a training program loaded to the on-chip memory 120. The processor 110 may include homogeneous multi-core processors or heterogeneous multi-core processors. For example, the processor 110 may include at least one of a central processing unit (CPU), an image signal processing unit (ISP), a digital signal processing unit (DSP), a graphics processing unit (GPU), a vision processing unit (VPU), and a neural processing unit (NPU).

An application program, an operating system, a file system, a device driver, etc. for driving the electronic device 10 may be loaded onto the on-chip memory 120. Referring to FIG. 3, the training program may be loaded to the on-chip memory 120. For example, the on-chip memory 120 may be an SRAM device that is implemented within the SoC 100 and has a faster data input/output speed than the memory device 200. The on-chip memory 120 may be referred to as a "buffer memory".

The memory controller 130 may communicate with the memory device 200 (refer to FIG. 1) under control of the DDR PHY 140. The memory controller 130 may access the memory device 200 in a direct memory access (DMA) manner. The memory controller 130 may include a command (CMD) queue 131, a command scheduler 132, a read data queue 133, and a write data queue 134.

The command queue 131 may store commands and addresses generated by the processor 110. A command and an address stored in the command queue 131 may be provided to the DDR PHY 140 under control of the command scheduler 132. One or more commands and one or more addresses stored in the command queue 131 may be provided to the DDR PHY 140 in parallel. The command scheduler 132 may adjust an order of commands and addresses stored in the command queue 131, a point in time when a command(s) and an address(es) are input to the command queue 131, a point in time when a command(s) and an address(es) are output from the command queue 131, etc.

In an embodiment, under control of the training program executed by the processor 110, the command queue 131 may generate a read command, a write command, test data, etc. for the FIFO training. Under control of the training program executed by the processor 110, the command queue 131 may generate commands (e.g., an interval oscillator start command OSC_Start and an interval oscillator stop command OSC_Stop) for the interval oscillator training. However, the present disclosure is not limited thereto. In another embodiment, the memory controller 130 or the DDR PHY 140 may include a separate circuit (not illustrated) for generating commands for the FIFO training and the interval oscillator training.

The read data queue 133 may store the read data received from the memory device 200 through the DDR PHY 140 as a response to the read request for the memory device 200 issued by the SoC 100. The read data stored in the read data queue 133 may be provided to the on-chip memory 120 so as to be processed by the processor 110. The write data queue 134 may store write data to be stored in the memory device 200. The write data stored in the write data queue 134 in response to the write request for the memory device 200 issued by the SoC 100 may be transmitted to the memory device 200 through the DDR PHY 140. For example, the command queue 131, the command scheduler 132, the read data queue 133, and the write data queue 134 of the memory controller 130 may be implemented within the SoC 100 in the form of hardware or software or in the form of a combination of hardware and software.

The DDR PHY 140 may include a clock (CK) generator 141, a command and address (CMD/ADD) generator 142, a write clock (WCK) generator 143, an RDQS receiver 144, a delay circuit 145, a data receiver 146, a delay circuit 147, and a data transmitter 148. The clock generator 141, the command and address generator 142, the write clock generator 143, the RDQS receiver 144, the delay circuit 145, the data receiver 146, the delay circuit 147, and the data transmitter 148 of the DDR PHY 140 may be implemented within the SoC 100 in the form of hardware or software or in the form of a combination of hardware and software.

The clock generator 141 may generate the clock CK to be output to the memory device 200. Although briefly illustrated in FIG. 2, for example, the clock generator 141 may generate differential clocks CK_t and CK_c and may transmit the differential clocks CK_t and CK_c to the memory device 200. For example, the clock generator 141 may include a duty cycle corrector (DCC) and/or a duty cycle adjuster (DCA) that corrects the duty cycle of the clock CK.

The command and address generator 142 may receive a command or an address from the command queue 131 and may transmit the command and/or the address to the memory device 200. For example, the command and address generator 142 may sequentially transmit the interval oscillator start command OSC_Start and the interval oscillator stop command OSC_Stop to the memory device 200, with a time interval (or the number of times of toggling) defined by the JEDEC standard interposed therebetween. The number of command and address transmission paths between the command and address generator 142 and the memory device 200, logical states of signals to be transmitted through the above-described transmission paths, a way to transmit, etc. may be defined in the JEDEC standard.

The write clock generator 143 may generate the write clock WCK which is output to the memory device 200. Although briefly illustrated in FIG. 2, for example, the write clock generator 143 may generate differential write clocks (e.g., WCK_t and WCK_c) and may transmit the write clocks WCK_t and WCK_c to the memory device 200. For example, the write clock generator 143 may also include the DCC (not illustrated) and/or the DCA (not illustrated) that adjusts the duty cycle of the write clock WCK.

In an embodiment, the clock CK and the write clock WCK may be generated based on the same phase lock loop (PLL). In this case, to generate the clock CK whose frequency is lower than that of the write clock WCK, the DDR PHY 140 may further include a divider (not illustrated).

In the read operation for the memory device 200, the RDQS receiver 144 may receive the read data strobe signal RDQS from the memory device 200.

The delay circuit 145 may align the skew of the read data strobe signal RDQS such that the data receiver 146 is capable of latching the read DQ by using the read data strobe signal RDQS at the given timing. The delay circuit 145 may operate when the read gate training described with reference to operation S15 of FIG. 2 is performed. For example, the delay circuit 145 may include a delay locked loop (DLL) that includes a plurality of delay cells. For example, a read DQ aligner (not illustrated) may find an optimal sampling point for latching the read DQ while delaying the read DQ based on a unit time corresponding to a delay time of one delay cell. Meanwhile, an example in which the delay circuit 145 is a component placed outside the RDQS receiver 144 is illustrated in FIG. 3, but the delay circuit 145 may be implemented within the RDQS receiver 144.

In the read operation for the memory device 200, the data receiver 146 may receive the read DQ from memory device 200. The data receiver 146 may latch the read DQ based on the input timing of the read data strobe signal RDQS received from the delay circuit 145. The data receiver 146 may provide the received read data to the read data queue 133. Although not illustrated in drawing, the DDR PHY 140 may further include a delay circuit (not illustrated) for delaying the read DQ to be input to the data receiver 146. In this case, the delay circuit (not illustrated) may operate together with the delay circuit 145 so as to be used to obtain the optimal sampling point for latching the read DQ.

The delay circuit 147 may align the skew of the write DQ such that the write DQ transmitted from the DDR PHY 140 to the memory device 200 is capable of being latched by the memory device 200 at the given timing. The delay circuit 147 may operate in the FIFO training and/or the interval oscillator training. For example, the delay circuit 147 may include a DLL including a plurality of delay cells.

The data transmitter 148 may transmit the write data received from the delay circuit 147 to the memory device 200 as the write DQ. In an embodiment, the delay circuit 147 may be implemented as a part of the data transmitter 148, not a separate component.

An embodiment in which the DDR PHY 140 includes the delay circuit 145 adjusting the skew of the read data strobe signal RDQS and the delay circuit 147 adjusting the skew of the write DQ to be transmitted to the memory device 200 is illustrated; in another embodiment, the DDR PHY 140 may include only one of the delay circuits 145 and 147.

In an embodiment, the delay circuits 145 and 147 may be controlled by the memory controller 130 and/or the training program executed by the processor 110. To this end, the memory controller 130 may in advance obtain information about a skew to be adjusted (i.e., the counting value of FIG. 1) from the memory device 200 through the FIFO training and the interval oscillator training.

In an embodiment, the training program that is executed by the processor 110 may calculate a valid window margin (VWM) based on the counting value. The valid window margin may mean a maximum of period (or time period) in which the data receiver 146 is capable of determining the read DQ output from the memory device 200 by using the read data strobe signal RDQS output from the memory device 200, and may also mean a maximum of period (or time period) in which the memory device 200 is capable of determining the write DQ output from the DDR PHY 140 by using the write clock WCK output from the SoC 100. For example, the valid window margin calculated by the training program may be stored in the on-chip memory 120.

The DDR PHY 140 may include a training circuit 149 configured to perform the FIFO training and/or the interval oscillator training. The training circuit 149 may control the delay circuit 145 such that the read data strobe signal RDQS is delayed (read interval oscillator training) or may control the delay circuit 147 such that the write DQ is delayed (write interval oscillator training).

Figure 4:
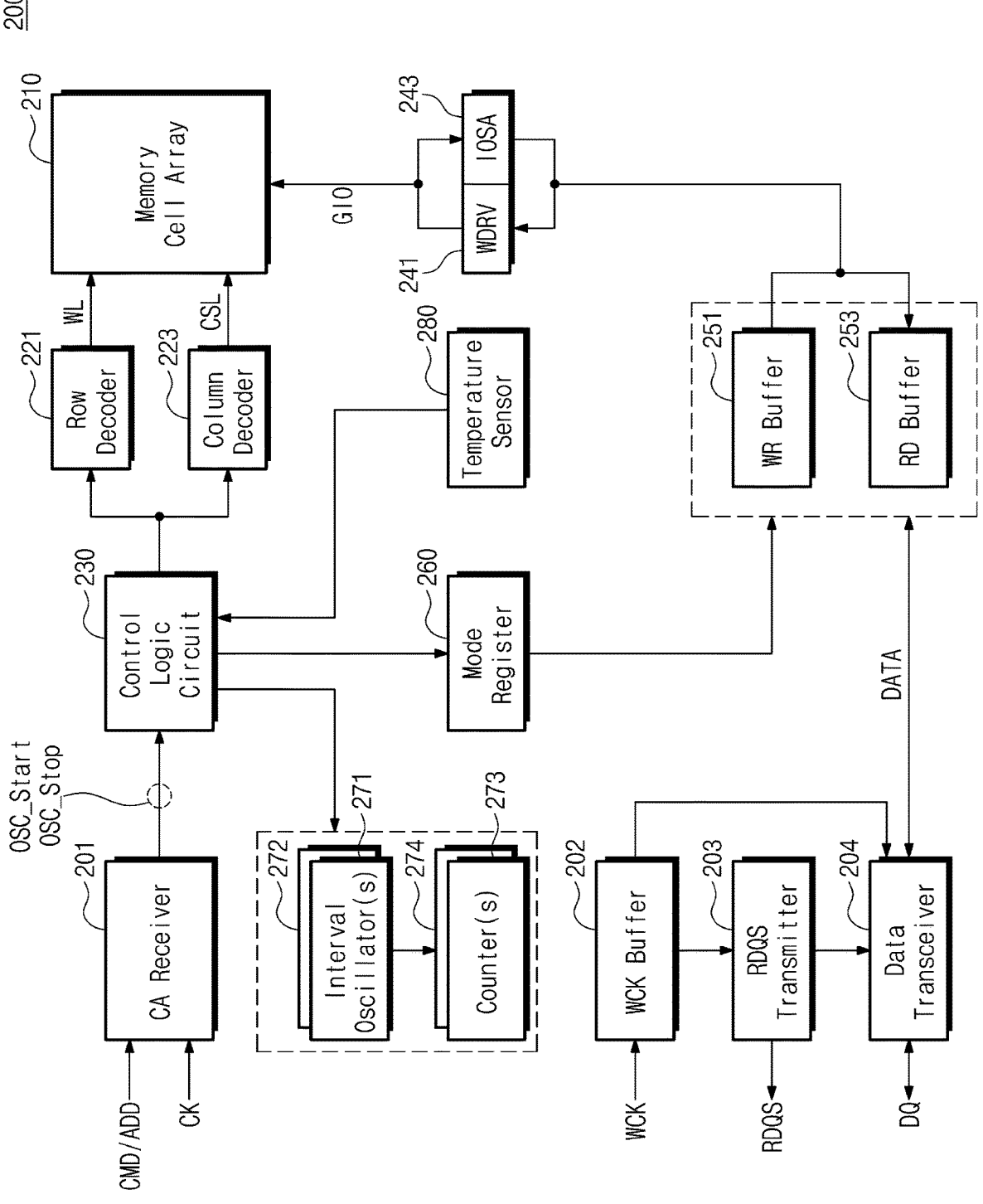
FIG. 4 is a diagram illustrating a configuration of a memory device of FIG. 1.

FIG. 4 is a diagram illustrating a configuration of a memory device 200 of FIG. 1. The memory device 200 may include a command and address (CA) receiver 201, a write clock buffer 202, an RDQS transmitter 203, a data transceiver 204, a memory cell array 210, a row decoder 221, a column decoder 223, a control logic circuit 230, a write driver (WDRV) 241, an input/output sense amplifier (IOSA) 243, a write (WR) buffer 251, a read (RD) buffer 253, a mode register 260, the interval oscillators 271 and 272, corresponding counters 273 and 274, and the temperature sensor 280. The above components may be implemented within the memory device 200 in the form of hardware.

The command and address receiver 201 may receive the command CMD and the address ADD by latching the command and address signal CMD/ADD based on the clock CK received from the SoC 100. The received command CMD may be provided to the control logic circuit 230.

In an embodiment, the command and address receiver 201 may decode an activate command, a read command, a write command, a precharge command, a mode register write command, a multi-purpose command MPC, etc. For example, the multi-purpose command MPC may include a FIFO write command and a FIFO read command for the FIFO training, and may also include the interval oscillator start command OSC_Start and the interval oscillator stop command OSC_Stop for the interval oscillator training and a command for reading the counting value stored in the mode register 260.

The write clock buffer 202 may receive the write clock WCK from the SoC 100 (refer to FIG. 1). The SoC 100 may transmit the write clocks WCK_t and WCK_c to the memory device 200 in a differential scheme, and the memory device 200 may include write clock buffers that respectively receives the write clocks WCK_t and WCK_c. The write clock buffer 202 may provide the data transceiver 204 with the write clock WCK received in the write operation for the memory device 200. In an embodiment, to generate write clocks with different phases based on the received write clock WCK, the write clock buffer 202 may include a phase splitter (not explicitly illustrated, but implied). However, in another embodiment, the phase splitter (not illustrated) may be implemented outside the write clock buffer 202.

The data transceiver 204 may receive the write DQ from the SoC 100 or may output the read DQ to the SoC 100. In the write operation for the memory device 200, the data transceiver 204 may latch the write DQ based on the write clock WCK. In the read operation for the memory device 200, the data transceiver 204 may transmit the read DQ to the SoC 100 together with the transmission of the read data strobe signal RDQS. For example, because the data signal DQ is a bidirectional signal, the data transceiver 204 may include a receiver (not illustrated) receiving the write DQ and a transmitter (not illustrated) outputting the read DQ.

The memory cell array 210 may include a plurality of memory cells connected with word lines (not illustrated) and bit lines (not illustrated). For example, the memory cell may be a dynamic random access memory (DRAM) cell. In this case, the DDR PHY 140 (refer to FIG. 1) and the memory device 200 may communicate with each other based on one of standards such as double data rate (DDR), low power double data rate (LPDDR), graphics double data rate (GDDR), wide I/O, high bandwidth memory (HBM), and hybrid memory cube (HMC).

The row decoder 221 may decode a row address received from the control logic circuit 230. The row decoder 221 may select and activate at least one word line corresponding to the row address. The column decoder 223 may decode a column address under control of the control logic circuit 230. The column decoder 223 may select and activate at least one column selection line corresponding to the column address. Two or more bit lines may be connected with a column selection line. For example, memory cells corresponding to the row address and the column address may be selected, and a data input/output may be performed on the selected memory cells.

The control logic circuit 230 may control the components of the memory device 200. The control logic circuit 230 may provide an address, which is transmitted together with the multi-purpose command MPC, to internal registers (not illustrated), the write buffer 251, or the read buffer 253 of the memory device 200. In an embodiment, the address transmitted together with the command may include an address of memory cells of the memory device 200, may include a code to be used to set an operating mode of the memory device 200, or may include test data for FIFO training to be stored in the write buffer 251 or the read buffer 253.

In an embodiment, the control logic circuit 230 may generate signals for enabling the interval oscillators 271 and 272 and the counters 273 and 274 based on the interval oscillator start command OSC_Start. Also, the control logic circuit 230 may generate signals for disabling the interval oscillators 271 and 272 and the counters 273 and 274 based on the interval oscillator stop command OSC_Stop.

In an embodiment, for read interval oscillator training, the control logic circuit 230 may sequentially provide an enable signal and a disable signal to the interval oscillator 271. For write interval oscillator training, the control logic circuit 230 may sequentially provide an enable signal and a disable signal to the interval oscillator 272. Herein, the enable signal and the disable signal may be input to each of the interval oscillators 271 and 272, with a time interval (or the number of times of toggling) defined by the JEDEC standard interposed therebetween. As in the above description, the control logic circuit 230 may control the counters 273 and 274.

A value counted by the counter 273 during the operation of the interval oscillator 271 and a value counted by the counter 274 during the operation of the interval oscillator 272 may be stored in the mode register 260. The memory device 200 may transmit the counting values to the SoC 100 (refer to FIG. 1) through the data transceiver 204 in response to a mode register read command from the SoC 100.

The write buffer 251 may receive write data from the write driver 241 and may write the write data in the selected memory cells in the memory array 210 through an input/output line GIO. The input/output sense amplifier 243 may sense the read data output from the selected memory cells through the input/output line GIO and may provide the read data to the read buffer 253.

The write buffer 251 may receive the read data strobe signal RDQS and the write DQ from the SoC 100 through the RDQS transmitter 203 and the data transceiver 204. The write buffer 251 may parallelize the received write DQ and may store the parallelized write data in the FIFO (not illustrated) of the write buffer 251. The write buffer 251 may provide the write data stored in the FIFO to the write driver 241. The read buffer 253 may receive the read data from the input/output sense amplifier 243. The read buffer 253 may store the received read data in the FIFO (not illustrated) of the read buffer 253. The read buffer 253 may serialize the read data and may provide the serialized read data to the data transceiver 204.

The interval oscillator 271 may be implemented to replicate a path difference of the write clock WCK and the read DQ (i.e., a timing difference between the write clock WCK path and the read DQ path), and the interval oscillator 272 may be implemented to replicate a path difference of the write clock WCK and the write DQ (i.e., a timing difference between the write clock WCK path and the write DQ path). The counters 273 and 274 may increase the counting values while the interval oscillators 271 and 272 operate. For example, the final counting value of the first counter 273 may correspond to a skew value of the read DQ to be adjusted or a skew value of the read data strobe signal RDQS to be adjusted, based at least in part on timing difference between the write clock WCK path and the read DQ path measured by the interval oscillator 271. For example, the final counting value of the second counter 274 may correspond to a skew value of the write DQ to be adjusted, based at least in part on the timing difference between the write clock WCK path and the write DQ path measured by the interval oscillator 272. For example, the first interval oscillator 271 and the second interval oscillator 272 may not operate at the same time, and the first counter 273 and the second counter 274 may not operate at the same time.

Figure 5:
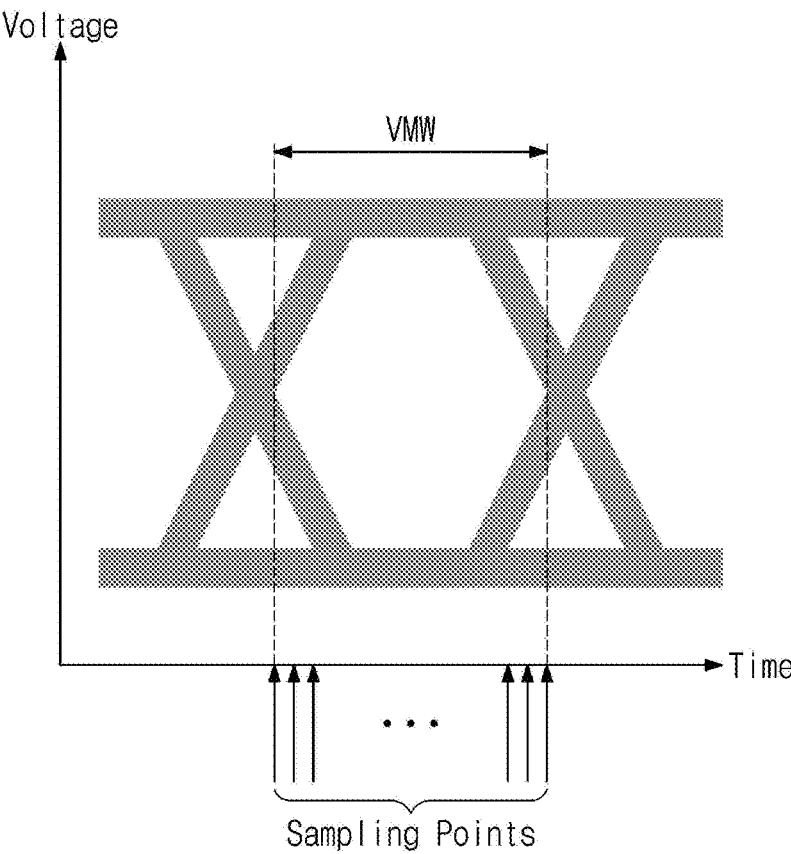
FIG. 5 is a diagram illustrating a valid window margin calculated by a training program of FIG. 3.

FIG. 5 is a diagram illustrating a valid window margin (VWM) calculated by a training program of FIG. 3. In FIG. 5, a horizontal axis represents time, and a vertical axis represents voltage level of a data signal DQ. In FIG. 5, a shaded portion may indicate an eye diagram (or an eye pattern) of the data signal DQ.

Referring to FIGS. 3 to 5, the training program executed by the processor 110 may calculate the valid window margin of the data signal DQ. The training program may control the delay circuit 145 and/or the delay circuit 147 to control the timing of the read data strobe signal RDQS and/or the timing of the read DQ. As such, a point in time (i.e., a sampling point) when the read DQ is sampled based on the read data strobe signal RDQS may be adjusted. As in the above description, the training program may control the delay circuit 147 to control the timing of the write DQ. As such, a point in time (i.e., a sampling point) when the write DQ is sampled based on the write clock WCK may be adjusted.

The training program executed by the processor 110 may find valid sampling points capable of validly sampling the data signal DQ from among a plurality of sampling points and may calculate the VWM of the data signal DQ from the valid sampling points. For example, all the sampling points illustrated in FIG. 3 may be valid sampling points. The training circuit 149 may calculate a difference between two valid sampling points or a value smaller than the difference as the VWM of the read DQ.

Figure 6:
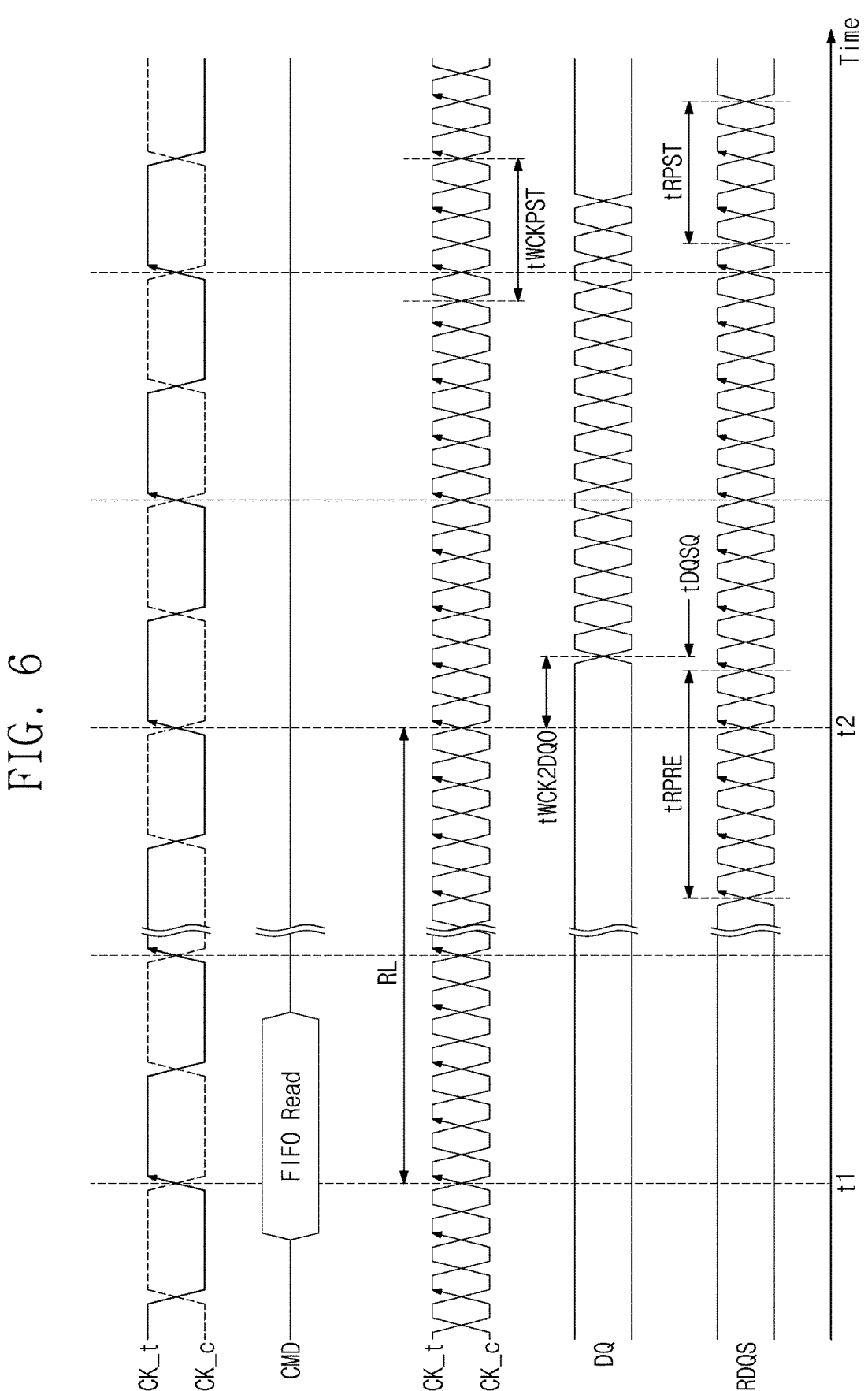
FIG. 6 is a timing diagram of signals between a SoC and a memory device in execution of FIFO read training.

FIG. 6 is a timing diagram of signals between the SoC 100 and the memory device 200 in the execution of FIFO read training.

Referring to FIGS. 3, 4, and 6, before issuing a FIFO read command, the SoC 100 may issue a command for synchronization between the write clock WCK and the clock CK. Afterwards, the SoC 100 may issue the FIFO read command, and the FIFO read command may be latched at a point in time t1. After the read latency RL between t1 and t2 passes and a little delay time tWCK2DQO then passes, the read DQ may be output from the memory device 200. Herein, the delay time may be referred to as a "write clock-read DQ interval (tWCK2DQO)". The tWCK2DQO may refer to a delay time of a path through which the write clock WCK is provided to latch the read DQ after the write clock WCK is input to the memory device 200.

The mismatch of the write clock WCK and the read DQ due to the tWCK2DQO may be corrected by the delay circuit 145 of the DDR PHY 140. In detail, the delay circuit 145 may delay the read data strobe signal RDQS output from the RDQS receiver 144 with reference to the counting value received from the memory device 200, and thus, the timing to latch the read DQ based on the read data strobe signal RDQS may be controlled in the SoC 100.

Figure 7:
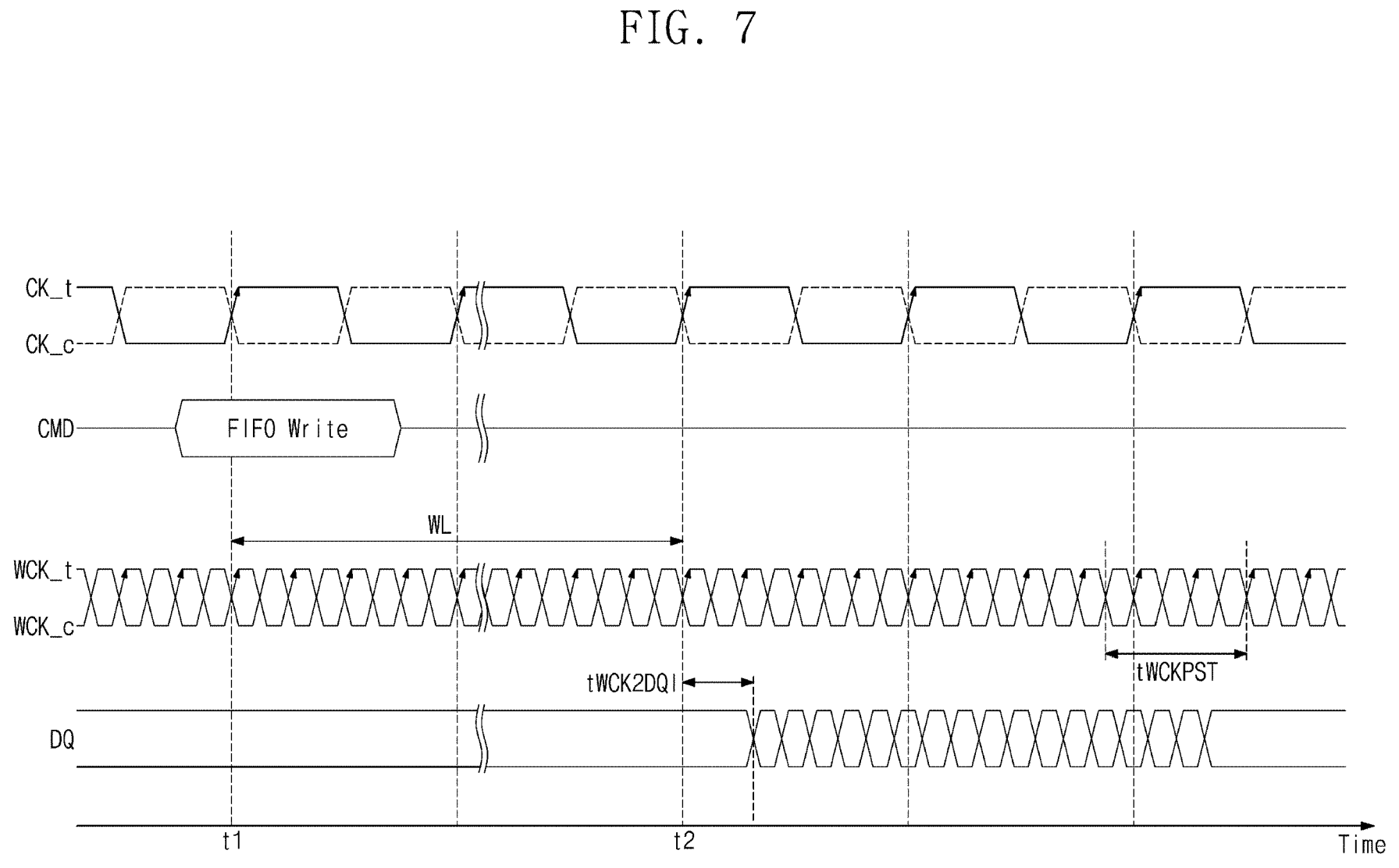

FIG. 7 is a timing diagram of signals between the SoC 100 and the memory device 200 in the execution of FIFO write training.

Referring to FIGS. 3, 4, and 7, the SoC 100 may issue a FIFO write command, and the FIFO write command may be latched at a point in time t1. After the write latency WL between t1 and t2 passes and a little delay time tWCK2DQI then passes, the write DQ may be input to the memory device 200. Herein, the delay time may be referred to as a "write clock-read DQ interval (tWCK2DQI)". The tWCK2DQI may refer to a delay time due to a difference between the path of the write clock WCK and the path of the read DQ.

The mismatch of the write clock WCK and the write DQ due to the tWCK2DQI may be corrected by the delay circuit 147 of the DDR PHY 140. In detail, the delay circuit 147 may delay the write DQ to be output from the data transmitter 148 with reference to the counting value received from the memory device 200, and thus, the timing to latch the write DQ based on the write clock WCK may be controlled in the memory device 200.

Figure 8:
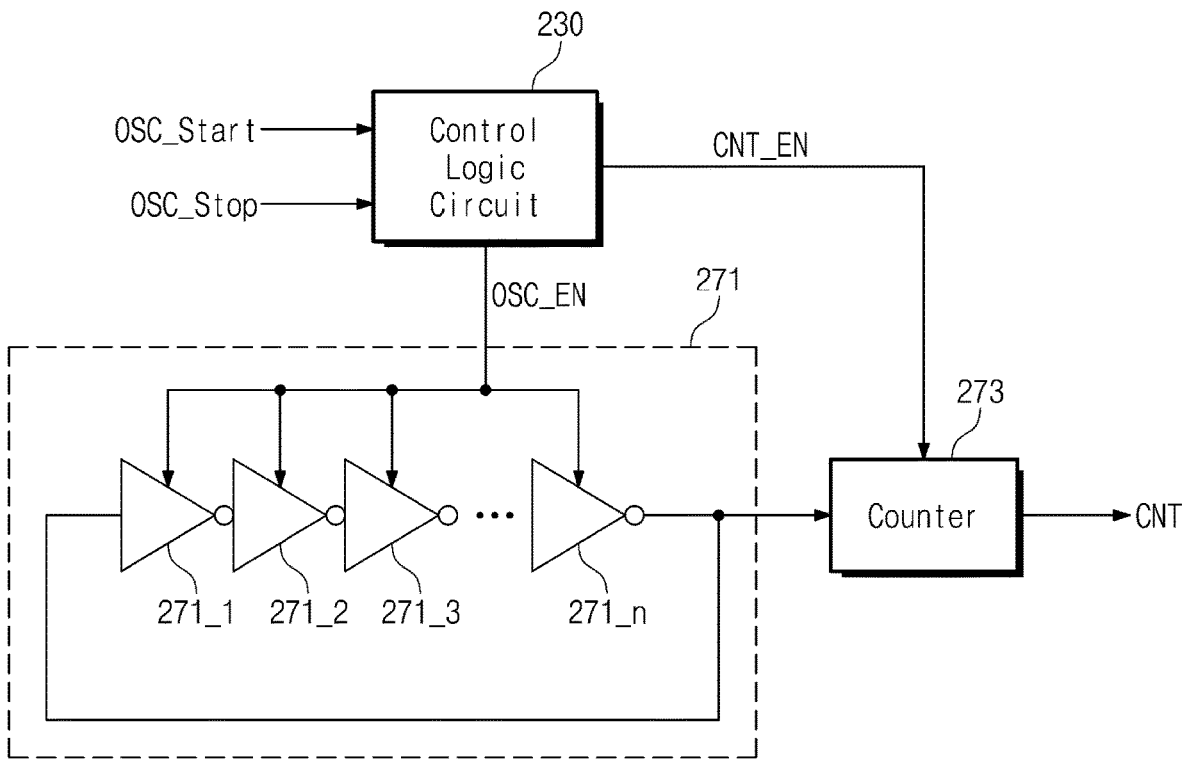
FIG. 8 is a circuit diagram of an interval oscillator of FIG. 4.

FIG. 8 is a circuit diagram illustrating an example of the interval oscillator 271 of FIG. 4. For better understanding, the control logic circuit 230 and the counter 273 are illustrated together.

The interval oscillator 271 may include a plurality of single-ended type inverters 271_1 to 271_n, where n is an integer. The inverters 271_1 to 271_n may be connected in series, and an output terminal of the inverter 271_n may be connected in common with an input terminal of the counter 273 and an input terminal of the inverter 271_1. The inverters 271_1 to 271_n may operate in response to an oscillator enable signal OSC_EN received from the control logic circuit 230.

First, in the initialization of the electronic device 10 (refer to FIG. 1), when the memory device 200 (refer to FIG. 1) receives the interval oscillator start command OSC_Start from the SoC 100 (refer to FIG. 1), the control logic circuit 230 may generate the oscillator enable signal OSC_EN and a counter enable signal CNT_EN based on the interval oscillator start command OSC_Start. The inverters 271_1 to 271_n may operate in response to the oscillator enable signal OSC_EN; whenever a signal is output from the inverter 271_n, the counter 273 may increase the counting value.

Afterwards, when the memory device 200 receives the interval oscillator stop command OSC_Stop from the SoC 100, the control logic circuit 230 may stop generating the oscillator enable signal OSC_EN. As such, the operation of the interval oscillator 271 may be stopped, and the counter 273 may output a final counting value CNT counted during the operation of the interval oscillator 271. The counting value CNT may be stored in the mode register 260.

In an embodiment, operations of the interval oscillator 272 and the counter 274 may be similar to those of the embodiment of FIG. 8. However, because the path of the read DQ and the path of the write DQ are different, the number of inverters constituting the interval oscillator 271 may be different from the number of inverters constituting the interval oscillator 272.

Figure 9:
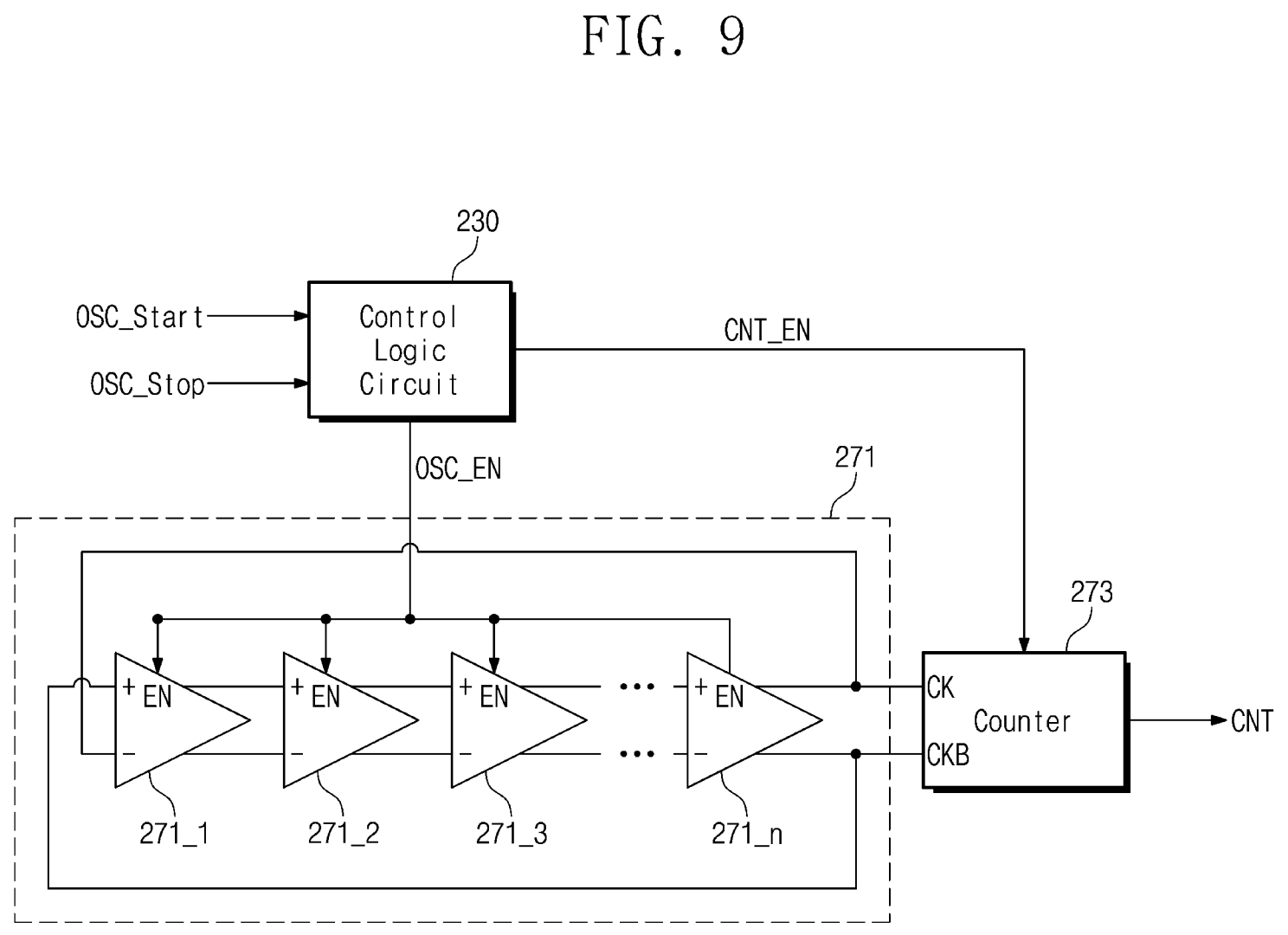

FIG. 9 is a circuit diagram illustrating another example of the interval oscillator 271 of FIG. 4. For better understanding, the control logic circuit 230 and the counter 273 are illustrated together.

The interval oscillator 271 may include a plurality of differential type inverters 271_1 to 271_n. The inverters 271_1 to 271_n may be connected in series, and a first output terminal (e.g., non-inverting output) of the inverter 271_n may be connected in common with an input terminal CK of the counter 273 and a negative input terminal of the inverter 272_1, in a negative feedback configuration. Similarly, a second output terminal (e.g., inverting output) of the inverter 271_n may be connected in common with an input terminal CKB of the counter 273 and a positive input terminal of the inverter 271_1.

An operation of the interval oscillator 271 of FIG. 9 may be mostly similar to the operation of the interval oscillator 271 of FIG. 8. The interval oscillator 271 may operate in a runtime period between the input of the interval oscillator start command OSC_Start and the input of the interval oscillator stop command OSC_Stop, and the counter 273 may increase the counting value while the interval oscillator 271 operates. When the operation of the interval oscillator 271 ends, the counter 273 may output the final counting value CNT. The counting value CNT may be stored in the mode register 260.

Figure 10:
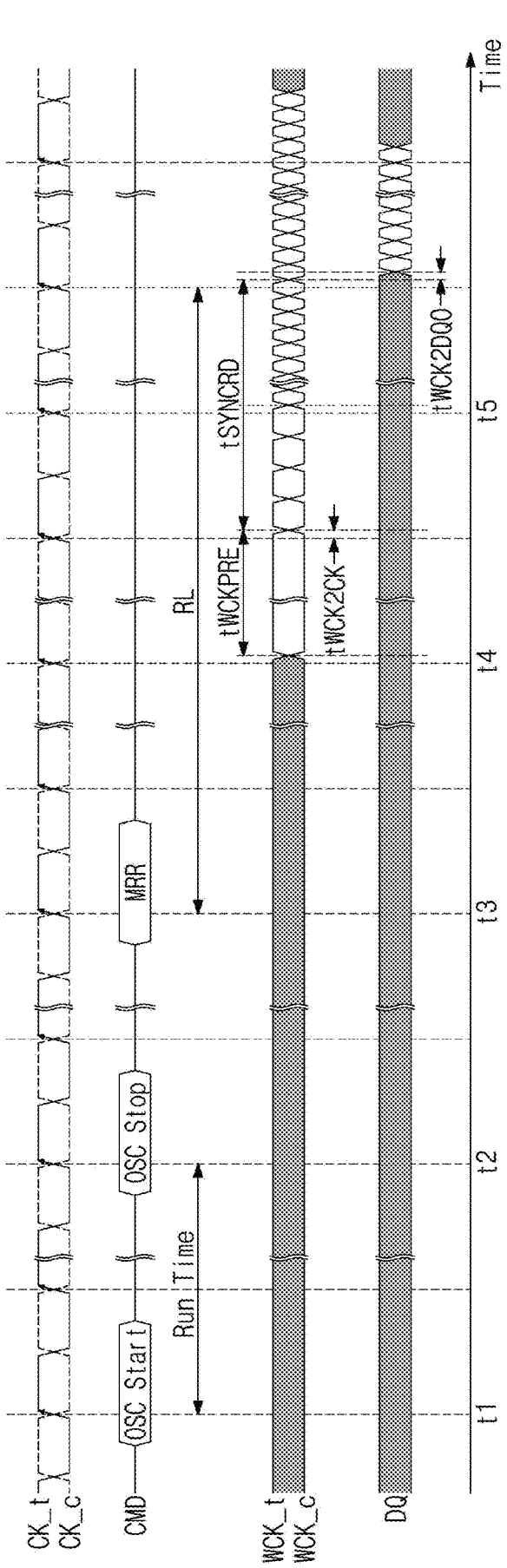
FIG. 10 is a timing diagram of signals between a SoC and a memory device in interval oscillator training.

FIG. 10 is a timing diagram of signals between the SoC 100 and the memory device 200 in interval oscillator training.

Referring to FIGS. 3, 4, and 10, after the initialization of the electronic device 10, the SoC 100 may issue the interval oscillator start command OSC_Start, and the memory device 200 may latch the interval oscillator start command OSC_Start based on the clocks CK_t and CK_c at a point in time t1. Afterwards, the SoC 100 may issue the interval oscillator stop command OSC_Stop, and the memory device 200 may latch the interval oscillator stop command OSC_Stop based on the clocks CK_t and CK_c at a point in time t2. Although an example in which one interval oscillator start command OSC_Start and one interval oscillator stop command OSC_Stop are input is illustrated in FIG. 10, to perform read interval oscillator training and write interval oscillator training, one interval oscillator start command OSC_Start and one interval oscillator stop command OSC_Stop may be further input to the memory device 200.

The interval oscillator 271 may operate during the runtime, and the counting value of the counter 273 may be stored in the mode register 260. As in the above description, the interval oscillator 272 may operate during the runtime between a next interval oscillator start command OSC_Start and a next interval oscillator stop command OSC_Stop, and the counting value of the counter 274 may be stored in the mode register 260.

Afterwards, the SoC 100 may issue a mode register read command MRR for reading the counting value stored in the mode register 260, and the memory device 200 may latch the mode register read command MRR based on the clocks CK_t and CK_c at a point in time t3.

After a point in time t4, a pre-toggling period tWCKPRE and a read sync period tSYNCRD may pass. At least a portion of the pre-toggling period tWCKPRE and the read sync period tSYNCRD may be included in the read latency period RL. After the delay time tWCK2DQO further passes, the read DQ may be output from the memory device 200.

Herein, the delay time tWCK2DQO may be caused by a path difference of the write clock WCK and the read DQ. The read DQ may include the counting value generated by the counter 273 and the counting value generated by the counter 274.

Figure 11:
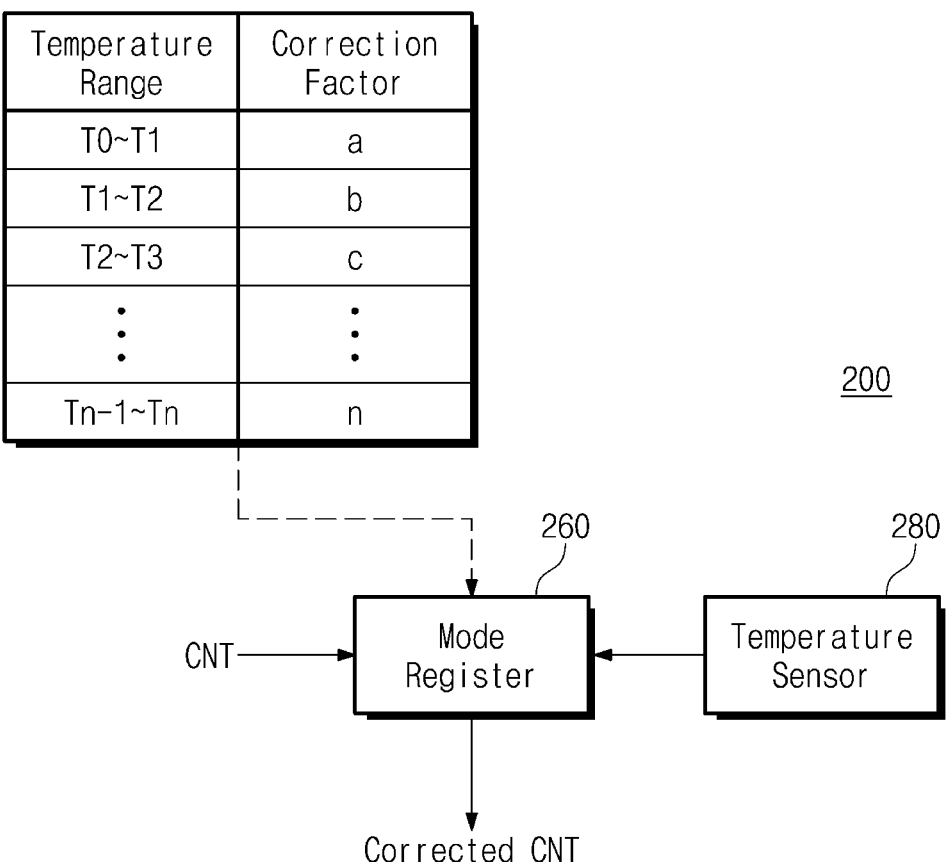
FIG. 11 is a diagram conceptually illustrating how to correct a counting value of an interval oscillator according to an embodiment of the present disclosure.

FIG. 11 is a diagram conceptually illustrating how to correct a counting value of an interval oscillator according to an embodiment of the present disclosure.

Referring to FIGS. 4, 8, and 11, the memory device 200 may store a table defining a correspondence relationship between a temperature range and a correction factor. For example, the memory device 200 may include a separate component for storing the table. Alternatively, the mode register 260 of the memory device 200 may store the table.

In an embodiment, temperatures may be classified into a plurality of ranges from T0 to T1, from T1 to T2, etc., and each temperature range may have a correction factor. It is to be appreciated that the temperature ranges may not necessarily be evenly divided. A correction factor of each temperature range may be a positive number, "0", or a negative number.

In an embodiment, the correction factor may be obtained in advance in the process of testing the electronic device 10 (refer to FIG. 1). For example, a correction factor may be obtained for each temperature range such that a difference (i.e., an offset) between a delay obtained during the FIFO training and a delay obtained during the interval oscillator training does not exceed a reference value. The reference value may refer to a threshold value at which the memory device 200 does not operate abnormally.

In an embodiment, when the counting value CNT is received from the counter 273, the mode register 260 may be configured to select a correction factor corresponding to a temperature range in which a temperature measured by the temperature sensor 280 belongs. The mode register 260 may be configured to apply the selected correction factor to the counting value CNT and to store the corrected counting value. The corrected counting value may be output to the SoC 100 in response to the mode register read command from the SoC 100.

Meanwhile, an operation of the counter 274 counting the output of the interval oscillator 272 may be identical to the above operation.

Figure 12:
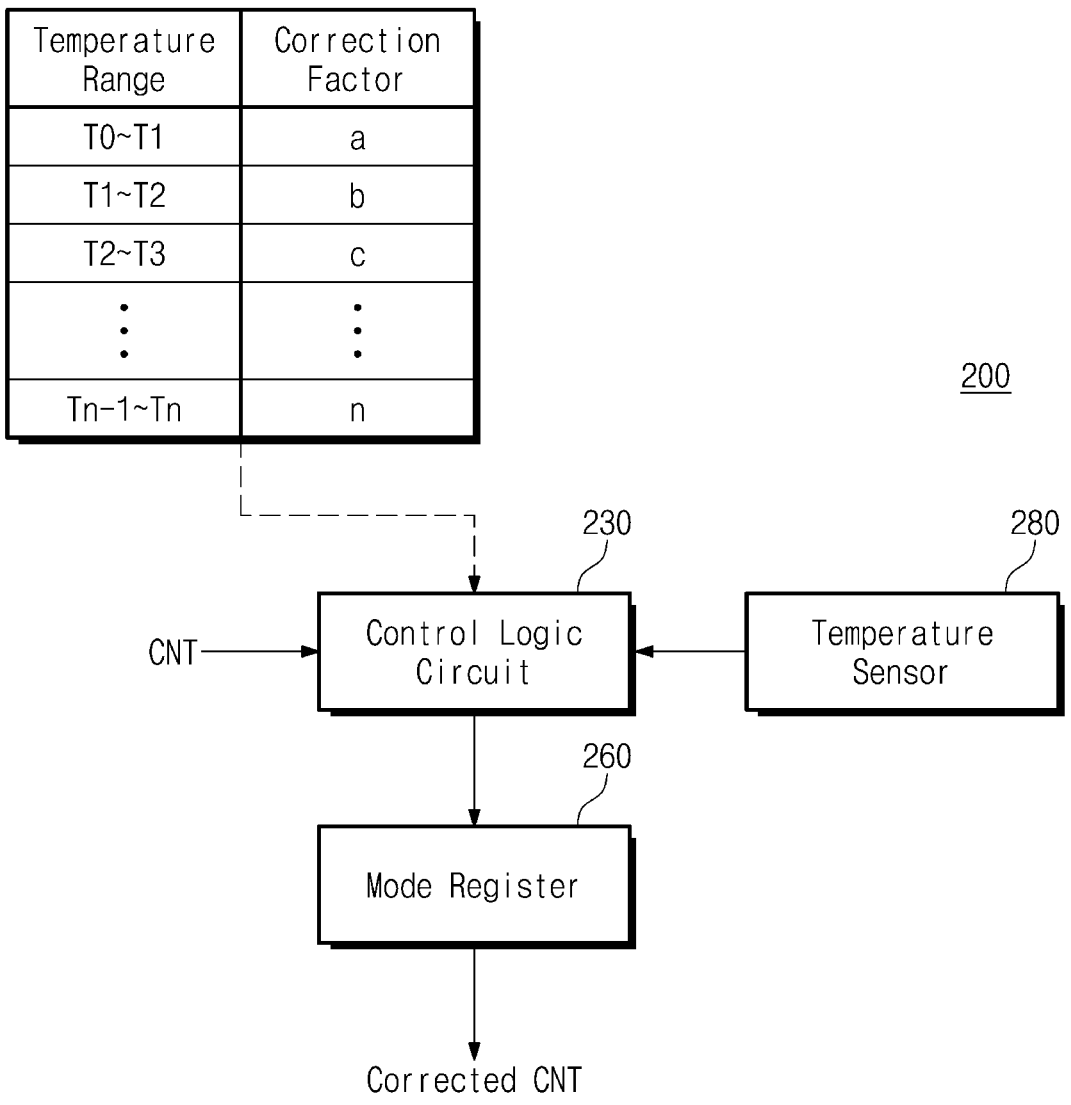
FIG. 12 is a diagram conceptually illustrating how to correct a counting value of an interval oscillator according to an embodiment of the present disclosure.

FIG. 12 is a diagram conceptually illustrating how to correct a counting value of an interval oscillator according to an embodiment of the present disclosure.

Operations of components illustrated in FIG. 12 are mostly similar to the operations of the components illustrated in FIG. 11. However, in an embodiment, the memory device 200 may include a separate component for storing the table, or the control logic circuit 230 may store the table.

Referring to FIGS. 4, 8, and 12 the counting value CNT output from the interval oscillator 271 may be input to the control logic circuit 230. The control logic circuit 230 may be configured to correct the counting value CNT with reference to the counting value CNT output from the interval oscillator 271, a temperature output from the temperature sensor 280, and the table. The control logic circuit 230 may provide the corrected counting value to the mode register 260, and the mode register 260 may store the corrected counting value. The corrected counting value may be output to the SoC 100 in response to the mode register read command from the SoC 100.

Likewise, an operation of the counter 274 counting the output of the interval oscillator 272 may be identical to the above operation.

Figure 13:
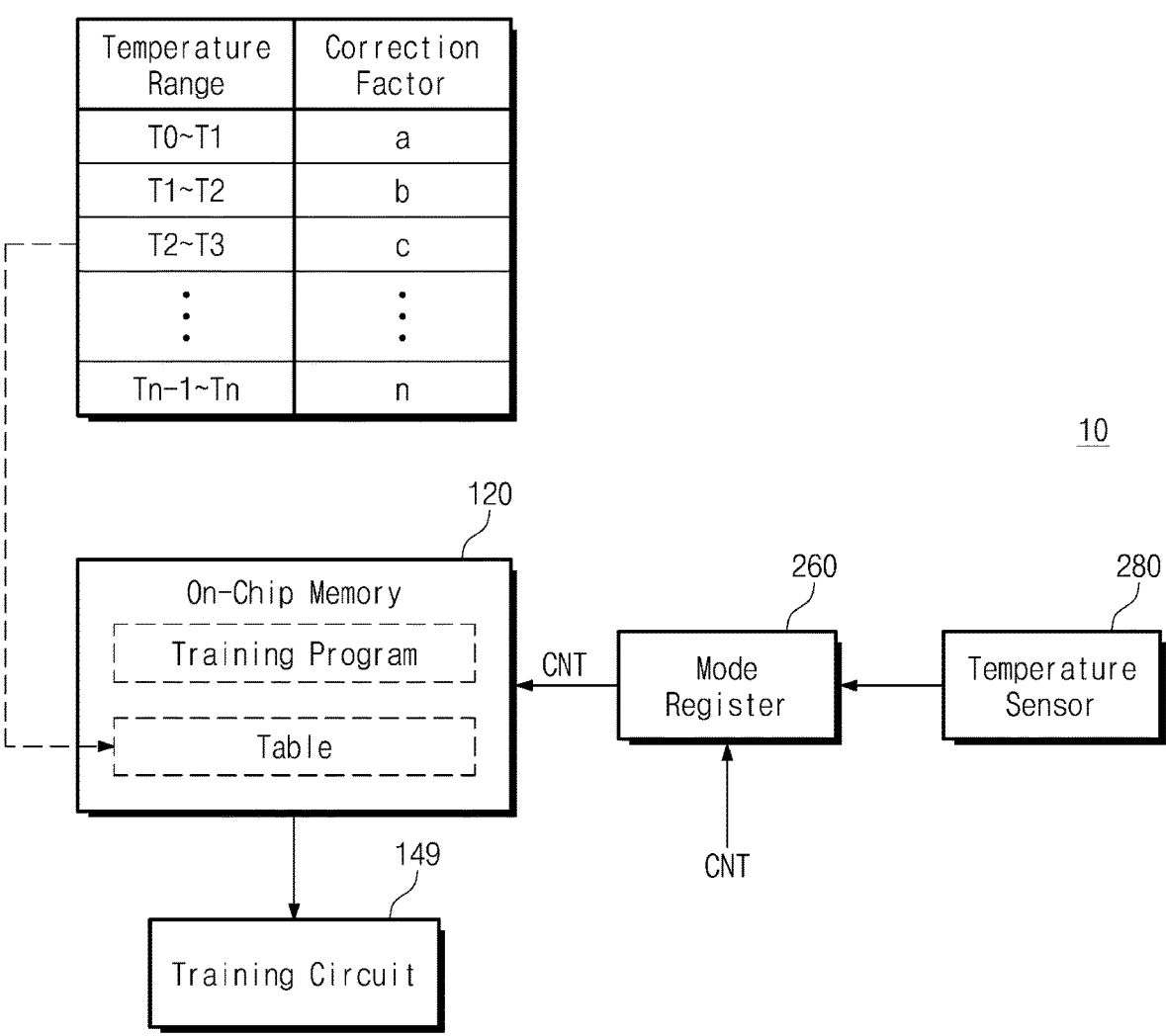
FIG. 13 is a diagram conceptually illustrating how to correct a counting value of an interval oscillator according to an embodiment of the present disclosure.

FIG. 13 is a diagram conceptually illustrating how to correct a counting value of an interval oscillator according to an embodiment of the present disclosure.

Unlike the above embodiments of FIGS. 11 and 12, in the embodiment of FIG. 13, the correction of the counting value may be made in the SoC 100. Referring to FIGS. 3, 8, and 13, the counting value CNT output from the interval oscillator 271 and the temperature information obtained by the temperature sensor 280 may be stored in the mode register 260. The memory device 200 may transmit the counting value CNT and the temperature information to the SoC 100 in response to the mode register read command received from the SoC 100. For example, the counting value CNT and the temperature information may be stored in the on-chip memory 120.

In an embodiment, the training program executed by the processor 110 may correct the counting value CNT based on the counting value CNT and the temperature information received from the memory device 200 and the table. For example, the table may be stored in the memory device 200 or in a separate storage space in the SoC 100 and may be loaded to the on-chip memory 120 in the execution of the training program. When the correction of the counting value CNT is completed, by using the corrected counting value, the training circuit 149 may control the delay circuit 145 such that the read data strobe signal RDQS is delayed (read interval oscillator training) or may control the delay circuit 147 such that the write DQ is delayed (write interval oscillator training).

Figure 14:
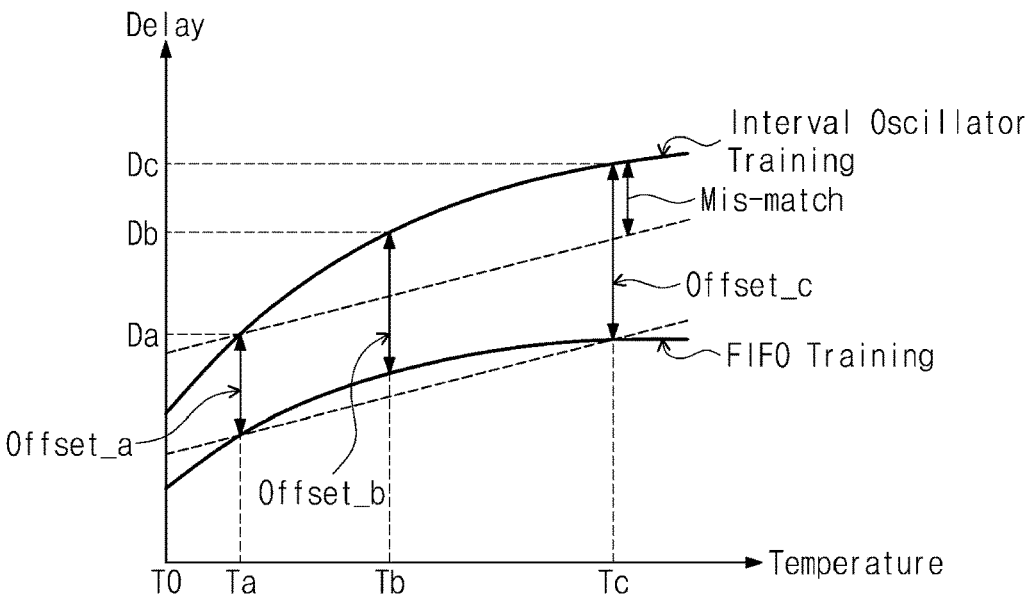
FIG. 14 is a graph illustrating an offset between a delay in FIFO training due to a temperature change and a delay in interval oscillator training due to a temperature change.

FIG. 14 is a graph illustrating an offset between a delay in FIFO training due to a temperature change and a delay in interval oscillator training due to a temperature change.

Referring to FIG. 14, because the FIFO training is performed based on an actual data input/output, the delay may be measured relatively accurately. For example, as a temperature increases, the delay may increase, but this is provided only as one example. The present disclosure is not limited thereto.

Meanwhile, because the interval oscillator training is based on an interval oscillator replicating a write path and a read path, the interval oscillator training is fast and simple, but the delay measured by the interval oscillator training is inaccurate. For example, as a temperature increases, the delay may increase; however, as a temperature increases, an offset difference with the delay of the FIFO training may further increase.

In an embodiment, an offset Offset_a at a temperature Ta may be smaller than an allowable value; in this case, even though the SoC performs training by using a delay time Da obtained in the interval oscillator training process, there is no problem in an operation of a memory device. However, for example, an offset Offset_b at a temperature Tb and offset Offset_c at a temperature Tc may be greater than the allowable value. In the case where the SoC performs training by using delay times Db and Dc obtained in the interval oscillator training process, a memory device may not operate normally.

Figure 15:
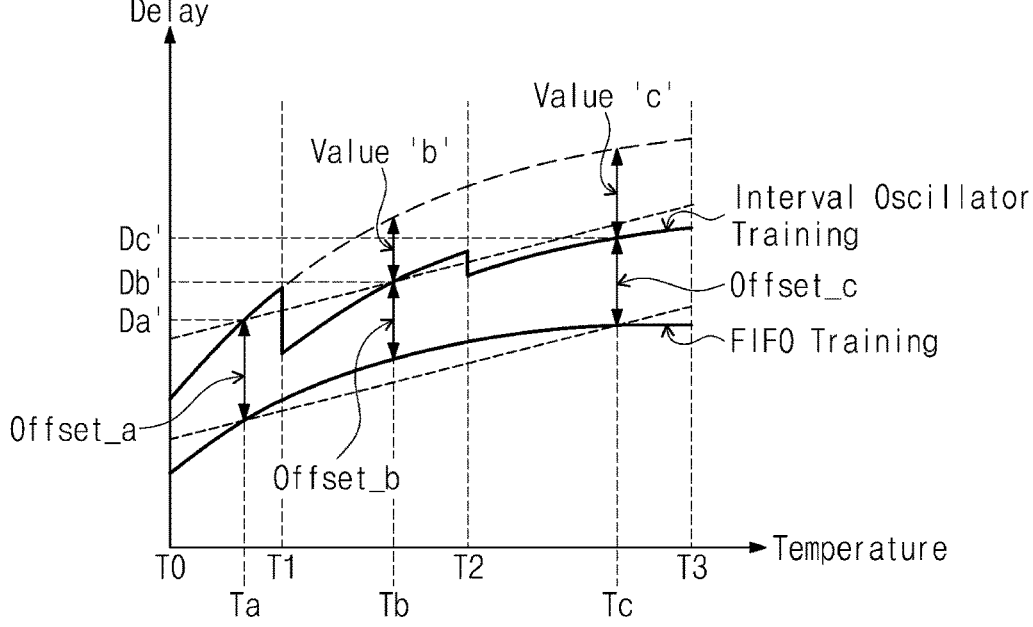
FIG. 15 is a graph conceptually illustrating how to correct a delay in interval oscillator training due to a temperature change, according to an embodiment of the present disclosure.

FIG. 15 is a graph conceptually illustrating how to correct a delay in interval oscillator training due to a temperature change, according to an embodiment of the present disclosure.

Referring to FIGS. 11 to 13 and 15, temperatures may be classified into a range being T0 or higher and lower than T1, a range being T1 or higher and lower than T2, and a range being T2 or higher and lower than T3.

Referring to FIGS. 3, 4, and 15, the control logic circuit 230 or the mode register 260 may correct the counting value of the counter 273 for each temperature range. For example, a delay time Da' obtained at a temperature Ta during the interval oscillator training may be within an allowable range. Accordingly, the correction factor corresponding to the range T0 to T1 in which the temperature Ta belongs may be "0", and the control logic circuit 230 or the mode register 260 may not correct the counting value of the counter 273. That is, the mode register 260 may store the counting value corresponding to the delay time tWCK2DQO or tWCK2DQI and may provide the counting value to the SoC 100 in response to the mode register read command from the SoC 100.

When the re-training is required as the temperature of the memory device changes from Ta to Tb, the SoC 100 may perform the interval oscillator training. The counter 273 may obtain the counting value corresponding to the delay time Db (refer to FIG. 14) as the training result, and the delay time Db may be out of the allowable range. Accordingly, the correction factor of the range T1 to T2 in which the temperature Tb belongs may be set to "b", and the control logic circuit 230 or the mode register 260 may correct the counting value of the counter 273. As a result, the counting value corresponding to a delay time Db' may be obtained, and the counting value may be stored in the mode register 260.

When the re-training is required as the temperature of the memory device changes from Tb to Tc, the SoC 100 may perform the interval oscillator training. The counter 273 may obtain the counting value corresponding to the delay time Dc (refer to FIG. 14) as the training result, and the delay time Dc may be out of the allowable range. Accordingly, the correction factor of the range T2 to T3 in which the temperature Tc belongs may be set to "c", and the control logic circuit 230 or the mode register 260 may correct the counting value of the counter 273. As a result, the counting value corresponding to a delay time Dc' may be obtained, and the counting value may be stored in the mode register 260.

Figure 16:
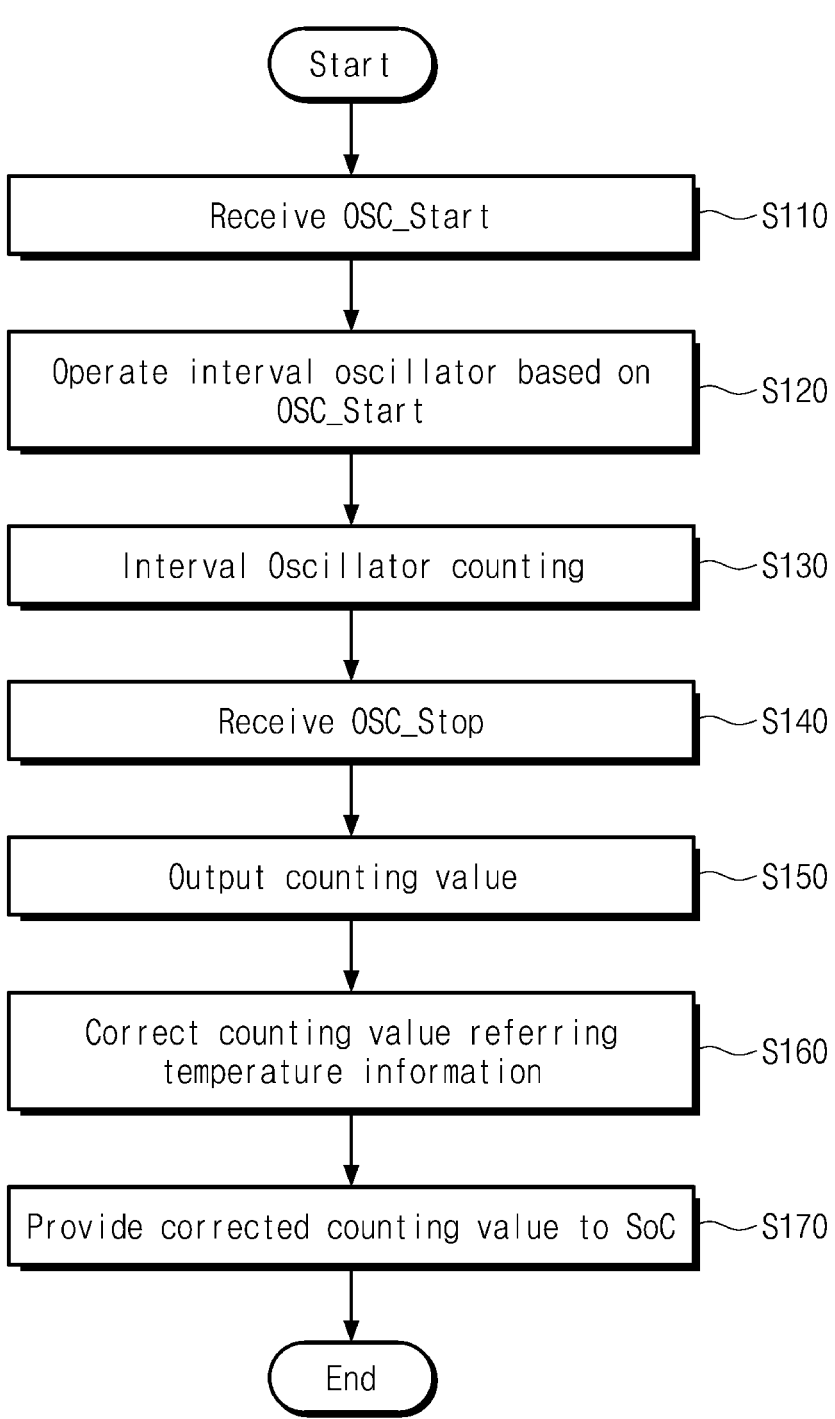
FIG. 16 is a flowchart of interval oscillator training according to an embodiment of the present disclosure.

FIG. 16 is a flowchart of interval oscillator training according to an embodiment of the present disclosure.

Referring to FIGS. 3, 4, and 16, in operation S110l, the memory device 200 may receive the interval oscillator start command OSC_Start based on the clock CK. The control logic circuit 230 may generate signals for enabling the interval oscillator 271 and the counter 273 based on the interval oscillator start command OSC_Start, and the interval oscillator 271 and the counter 273 may operate based on the signals from the control logic circuit 230 (S120).

In operation S130l, the counter 273 may count an output signal of the interval oscillator 271.

In operation S140, the memory device 200 may receive the interval oscillator stop command OSC_Stop based on the clock CK. The control logic circuit 230 may generate signals for disabling the interval oscillator 271 and the counter 273 based on the interval oscillator stop command OSC_Stop, and the interval oscillator 271 and the counter 273 may stop the operations based on the signals from the control logic circuit 230. The counter 273 may output a final counting value (S150).

In operation S160, the control logic circuit 230 or the mode register 260 may correct the counting value output from the counter 273 based on the table defining the correspondence relationship between the temperature range and the correction factor. For example, temperature information for referring to the table may be obtained by the temperature sensor 280 in the memory device.

In operation S170, the memory device 200 may provide the corrected counting value to the SoC 100 in response to the mode register read command from the SoC 100. The SoC 100 may adjust the skew of the read data strobe signal RDQS and/or the write DQ based on the corrected counting value.

Figure 17:
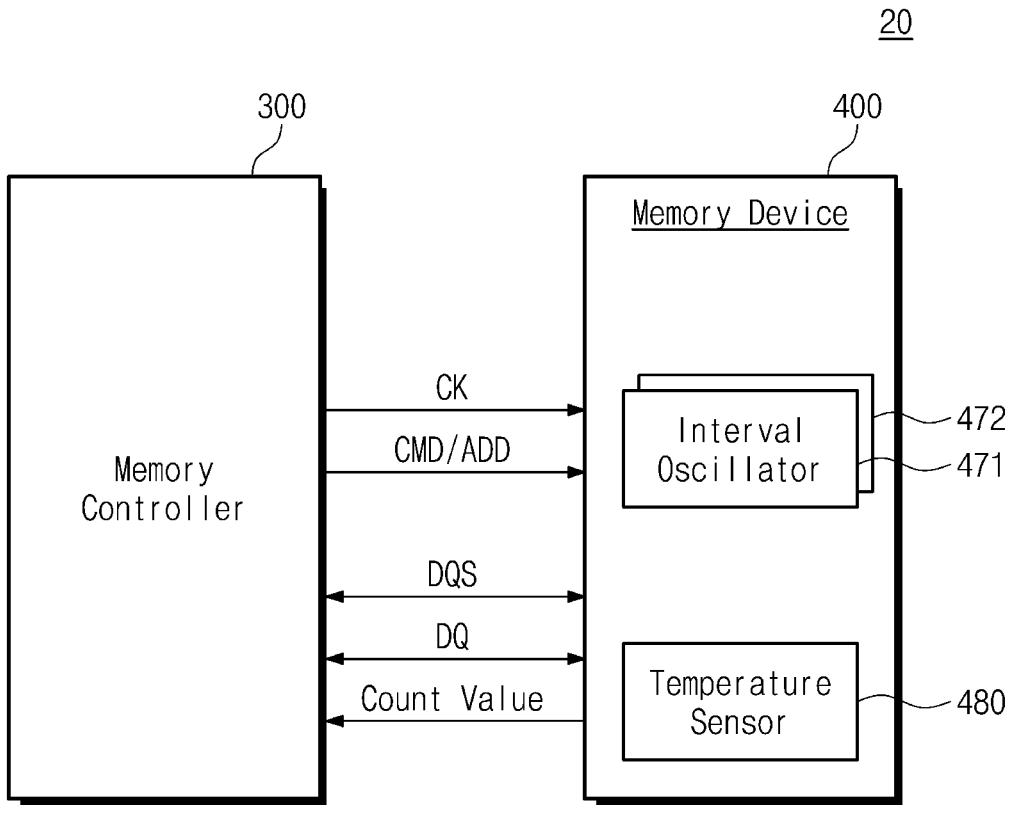
FIG. 17 is a diagram illustrating a configuration of an electronic device according to an embodiment of the present disclosure.

FIG. 17 is a diagram illustrating a configuration of an electronic device 20 according to an embodiment of the present disclosure. The electronic device 20 may include a memory controller 300 and a memory device 400.

The memory device 400 may receive the clock CK and the command and address signal CMD/ADD from the memory controller 300. The memory device 400 may obtain the command CMD and the address ADD by sampling the command and address signal CMD/ADD based on the clock CK. The memory device 400 may receive or output the data signal DQ by using a data strobe signal DQS. The memory device 400 may be a double data rate (DDR) SDRAM.

In an embodiment, configurations of the memory controller 300 and the memory device 400 may be mostly similar to the configurations of the memory controller 130 and the memory device 200 of FIG. 1. Thus, additional description associated with the memory controller 300 and the memory device 400 will be omitted to avoid redundancy. However, clocks (i.e., WCK and RDQS) having different frequencies may be used in the write operation and the read operation of the memory device 200 of FIG. 1; in contrast, the data strobe signal DQS may be used in the write operation and the read operation of the memory device 400 of FIG. 17.

In an embodiment, the memory controller 300 may perform the FIFO training on the memory device 400 in the initialization; after the initialization, the memory controller 300 may perform the interval oscillator training on the memory device 400 during the operation of the memory device 400. The interval oscillator training may include read interval oscillator training and write interval oscillator training; in this case, the read interval oscillator training may be performed by using an interval oscillator 471, and the write interval oscillator training may be performed by using an interval oscillator 472.

The interval oscillator 471 may be implemented to replicate a difference between the path of the data strobe signal DQS and the path of the read DQ, and the interval oscillator 472 may be implemented to replicate a difference of the path of the data strobe signal DQS and the path of the write DQ.

For example, a delay time due to the difference between the path of the data strobe signal DQS and the path of the read DQ may be "tDQS2DQO". As in the above description, a delay time due to the difference between the path of the data strobe signal DQS and the path of the write DQ may be "tDQS2DQI". Configurations and operations of the interval oscillators 471 and 472 may be mostly similar to those of the interval oscillator described with reference to FIGS. 8 and 9.

In an embodiment, a control logic circuit (e.g., similar to the control logic circuit 230 of FIG. 4) and/or a mode register (e.g., similar to the mode register 260) in the memory device 400 may correct counting values, which are counted while the interval oscillators 471 and 472 operate, based on the temperature measured by a temperature sensor 480. As a result, even though a temperature changes, a difference (i.e., an offset) between a delay time measured in the FIFO training and a delay time measured in the interval oscillator training may be within an allowable range.

Figure 18:
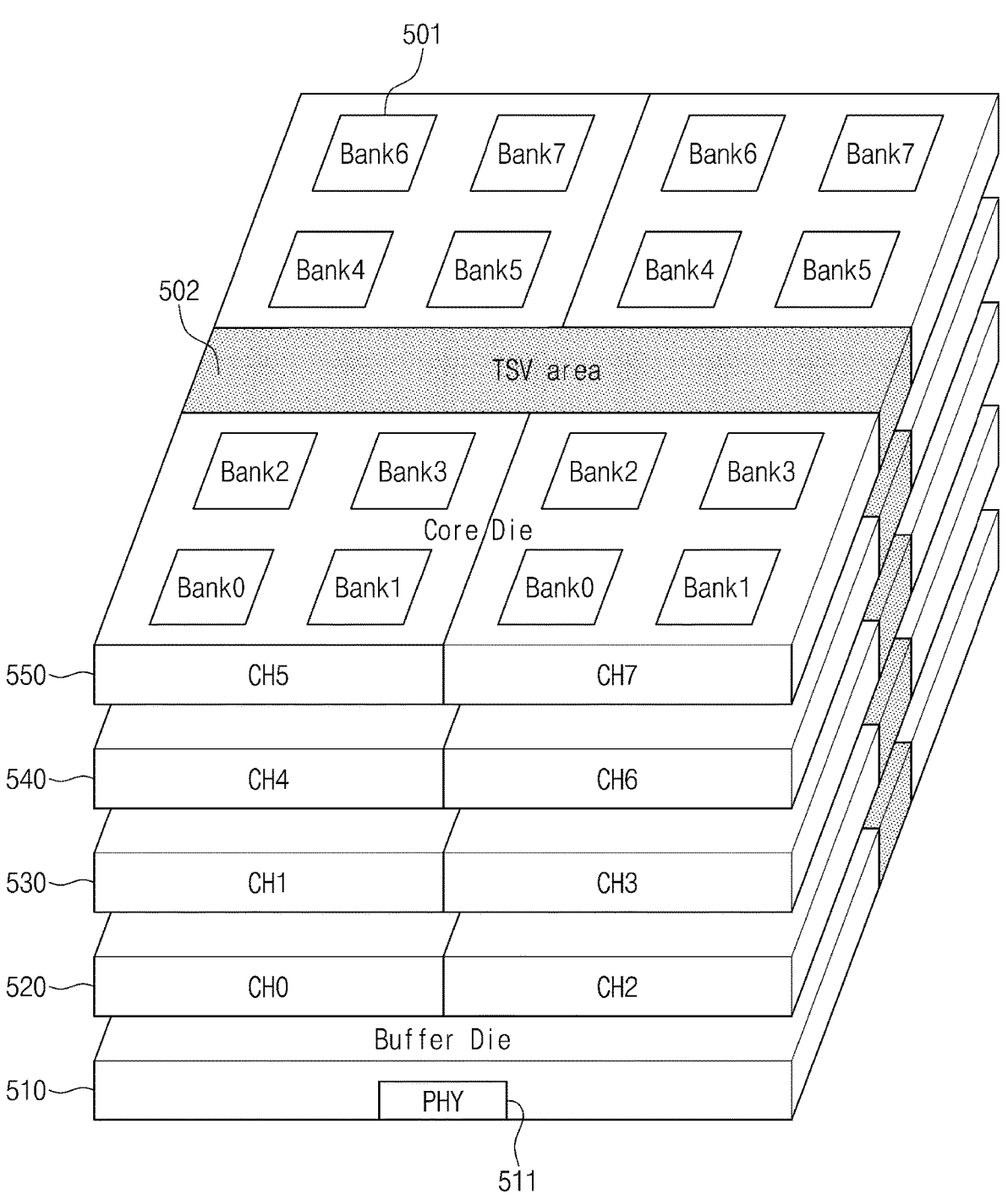
FIG. 18 is a diagram illustrating a stack-type memory device according to an embodiment of the present disclosure.

FIG. 18 is a diagram illustrating a stack-type memory device according to an embodiment of the present disclosure. Referring to FIG. 18, a stack-type memory device 500 may include a buffer die 510 and a plurality of core dies 520 to 550. For example, the buffer die 510 may be also referred to as an "interface die", a "base die", a "logic die", or a "master die", and each of the core dies 520 to 550 may be also referred to as a "memory die" or a "slave die". An example is illustrated in FIG. 18 as the stack-type memory device 500 includes the four core dies 520 to 550, but the number of core dies may be variously changed. For example, the stack-type memory device 500 may include 8, 12, or 16 core dies.

The buffer die 510 and the core dies 520 to 550 may be stacked and may be electrically connected by using through silicon vias (TSV). As such, the stack-type memory device 500 may have a three-dimensional memory structure in which the plurality of dies 510 to 550 are stacked. For example, the stack-type memory device 500 may be implemented in compliance with the HBM or HMC standard.

The stack-type memory device 500 may support a plurality of channels (or vaults) that are functionally independent of each other. For example, as illustrated in FIG. 15, the stack-type memory device 500 may support 8 channels CH0 to CH7. In the case where each of the channels CH0 to CH7 supports 128 DQ I/Os, the stack-type memory device 500 may support 1204 DQ I/Os. However, the inventive concept is not limited thereto. For example, the stack-type memory device 500 may support 1024 or more DQ I/Os and may support 8 or more channels (e.g., 16 channels). In the case where the stack-type memory device 500 supports 16 channels, each of the channels may support 64 DQ I/Os.

Each of the core dies 520 to 550 may support at least one channel. For example, as illustrated in FIG. 18, the core dies 520 to 550 may support channel pairs CH0 and CH2, CH1 and CH3, CH4 and CH6, and CH5 and CH7, respectively. In this case, the core dies 520 to 550 may support different channels. However, the inventive concept is not limited thereto. For example, at least two of the core dies 520 to 550 may support the same channel. For example, each of the core dies 520 to 550 may support the first channel CH0.

Each of channels may form an independent command and data interface. For example, channels may be independently clocked based on independent timing requirements and may not be synchronized. For example, based on an independent command, each channel may change a power state or may perform a refresh operation.

Each of the channels may include a plurality of memory banks 501. Each of the memory banks 501 may include memory cells connected with word lines and bit lines, a row decoder, a column decoder, a sense amplifier, etc. For example, as illustrated in FIG. 12, each of the channels CH0 to CH7 may support 8 memory banks 501. However, the inventive concept is not limited thereto. For example, each of the channels CH0 to CH7 may support 8 or more memory banks 501. An example is illustrated in FIG. 18 as memory banks belonging to one channel are included in one core die, but memory banks belonging to one channel may be distributed into a plurality of core dies. For example, in the case where each of the core dies 520 to 550 supports the first channel CH0, memory banks included in the first channel CH0 may be distributed into the core dies 520 to 550.

In an exemplary embodiment, one channel may be divided into two pseudo channels that operate independently of each other. For example, the pseudo channels may share a command and clock inputs (e.g., the clock CK and a clock enable signal CKE) of the corresponding channel but may independently decode and execute commands. For example, in the case where one channel supports 128 DQ I/Os, each of the pseudo channels may support 64 DQ I/Os. For example, in the case where one channel supports 64 DQ I/Os, each of the pseudo channels may support 32 DQ I/Os.

The buffer die 510 and the core dies 520 to 550 may include a TSV area 502. TSVs configured to penetrate the dies 510 to 550 may be disposed in the TSV area 502. The buffer die 510 may exchange signals and/or data with the core dies 520 to 550 through the TSVs. Each of the core dies 520 to 550 may exchange signals and/or data with the buffer die 510 through the TSVs, and the core dies 520 to 550 may exchange signals and/or data with each other through the TSVs. In this case, the signals and/or data may be independently exchanged through the corresponding TSVs for each channel. For example, in the case where an external host device transmits a command and an address to the first channel CH0 for the purpose of accessing a memory cell of the first core die 520, the buffer die 510 may transmit control signals to the first core die 520 through TSVs corresponding to the first channel CH0 and may access the memory cell of the first channel CH0.

The buffer die 510 may include a physical layer (PHY) 511. The physical layer 511 may include interface circuits for communication with the external host device. For example, the physical layer 511 may include the following interface circuits described with reference to FIGS. 1 to 16: the command and address receiver 201, the write clock buffer 202, the RDQS transmitter 203, the data transceiver 204, and the control logic circuit 230. Signals and/or data received through the physical layer 511 may be transmitted to the core dies 520 to 550 through the TSVs.

In an exemplary embodiment, the buffer die 510 may include channel controllers respectively corresponding to channels. A channel controller may manage memory reference operations of the corresponding channel and may determine a timing requirement of the corresponding channel.

In an exemplary embodiment, the buffer die 510 may include a plurality of pins for receiving signals from the external host device. Through the plurality of pins, the buffer die 510 may receive the clock CK, the command/address signal CMD/ADD, the data strobe signal DQS, and the data signal DQ and may transmit the data strobe signal DQS and the data signal DQ. For example, the buffer die 510 may include 2 pins for receiving the clock CK, 14 pins for receiving the command/address signal CMD/ADD, 8 pins for receiving the data strobe signal DQS, 8 pins for transmitting the data strobe signal DQS, and 128 pins for transmitting and receiving the data signal DQ, for each channel.

Figure 19:
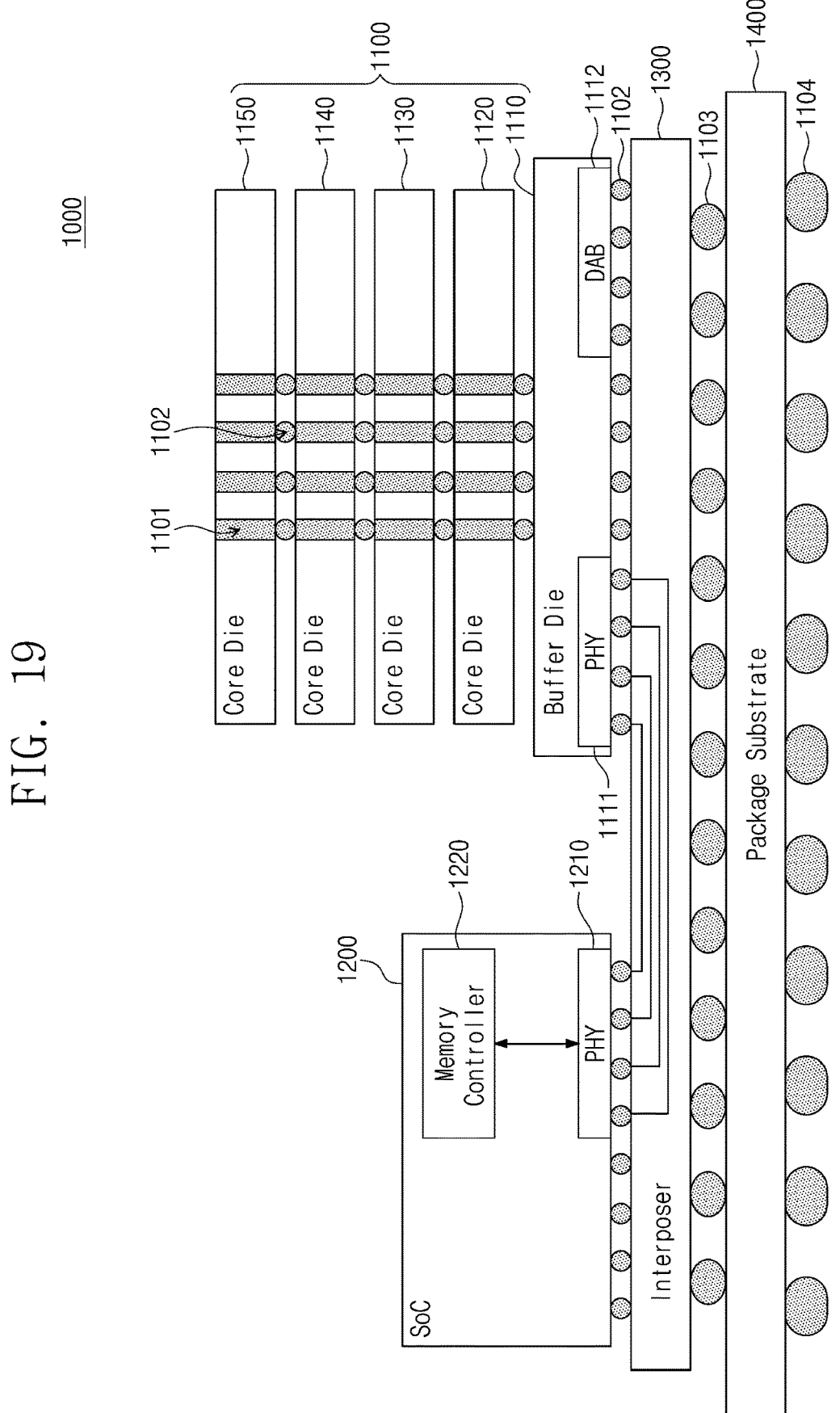
FIG. 19 is a diagram illustrating a semiconductor package according to an embodiment of the present disclosure.

FIG. 19 is a diagram illustrating a cross-sectional view of an exemplary semiconductor package according to an embodiment of the present disclosure. Referring to FIG. 19, a semiconductor package 1000 may include a stack-type memory device 1100, a system on chip 1200, an interposer 1300, and a package substrate 1400. The stack-type memory device 1100 may include a buffer die 1110 and core dies 1120 to 1150. The buffer die 1110 may correspond to the buffer die 510 of FIG. 18, and the core dies 1120 to 1150 may correspond to the core dies 520 to 550 of FIG. 18, respectively.

Each of the core dies 1120 to 1150 may include a memory cell array. The buffer die 1110 may include a physical layer 1111 and a direct access area (DAB) 1112. The physical layer 1111 may be electrically connected with a physical layer 1210 of the system on chip 1200. Through the physical layer 1111, the stack-type memory device 1100 may receive signals from the system on chip 1200 or may transmit signals to the system on chip 1200.

The direct access area 1112 may provide an access path capable of testing the stack-type memory device 1100 without passing through the system on chip 1200. The direct access area 1112 may include a conduction means (e.g., a port or a pin) capable of directly communicating with an external test device. A test signal and data received through the direct access area 1112 may be transmitted to the core dies 1120 to 1150 through TSVs. To test the core dies 1120 to 1150, the data read from the core dies 1120 to 1150 may be transmitted to the test device through the TSVs and the direct access area 1112. As such, a direct access test may be performed with respect to the core dies 1120 to 1150.

The buffer die 1110 and the core dies 1120 to 1150 may be electrically connected through TSV 1101 and bumps 1102. The buffer die 1110 may receive signals, which are provided to each channel through the bumps 1102 allocated for each channel, from the system on chip 1200. For example, the bumps 1102 may be micro-bumps.

The system on chip 1200 may execute applications that the semiconductor package 1000 supports, by using the stack-type memory device 1100. For example, the system on chip 1200 may include at least one of a central processing unit (CPU), an application processor (AP), a graphic processing unit (GPU), a neural processing unit (NPU), a tensor processing unit (TPU), a vision processing unit (VPU), an image signal processor (ISP), and a digital signal processor (DSP) and may execute specialized calculations.

The system on chip 1200 may include the physical layer 1210 and a memory controller 1220. The physical layer 1210 may include input/output circuits for exchanging signals with the physical layer 1111 of the stack-type memory device 1100. The system on chip 1200 may provide various signals to the physical layer 1111 through the physical layer 1210. The signals provided to the physical layer 1111 may be transmitted to the core dies 1120 to 1150 through the interface circuits of the physical layer 1111 and the TSVs 1101.

The memory controller 1220 may control overall operations of the stack-type memory device 1100. The memory controller 1220 may provide the stack-type memory device 1100 with signals for controlling the stack-type memory device 1100, through the physical layer 1210. The memory controller 1220 may correspond to the memory controller 130 of FIG. 1.

The interposer 1300 may connect the stack-type memory device 1100 and the system on chip 1200. The interposer 1300 may connect the physical layer 1111 of the stack-type memory device 1100 and the physical layer 1210 of the system on chip 1200 and may provide physical paths formed by using conductive materials. As such, the stack-type memory device 1100 and the system on chip 1200 may be stacked on the interposer 1300 and may exchange signals with each other.

The bumps 1103 may be attached on an upper surface of the package substrate 1400, and solder balls 1104 may be attached on a lower surface of the package substrate 1400. For example, the bumps 1103 may be flip-chip bumps. The interposer 1300 may be stacked on the package substrate 1400 through the bumps 1103. The semiconductor package 1000 may exchange signals with any other external package or semiconductor devices through the solder balls 1104. For example, the package substrate 1400 may be a printed circuit board PCB.

Figure 20:
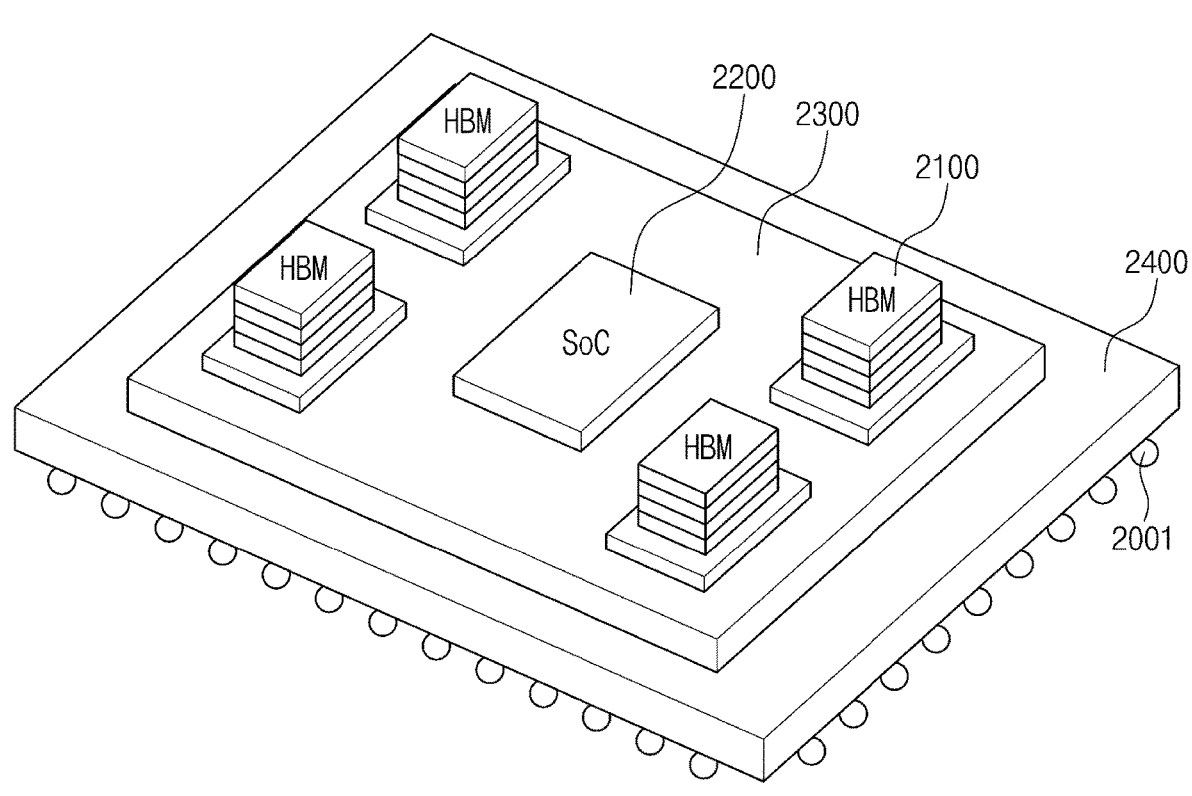
FIG. 20 is a diagram illustrating a semiconductor package according to an embodiment of the present disclosure.

FIG. 20 is a diagram illustrating a semiconductor package according to an embodiment of the present disclosure. Referring to FIG. 20, a semiconductor package 2000 may include a plurality of stack-type memory devices 2100 and a system on chip 2200. The stack-type memory devices 2100 and the system on chip 2200 may be stacked on an interposer 2300, and the interposer 2300 may be stacked on a package substrate 2400. The semiconductor package 2000 may exchange signals with any other external package or semiconductor devices through solder balls 2001 attached on a lower surface of the package substrate 2400.

Each of the stack-type memory devices 2100 may be implemented in compliance with the HBM standard. However, the inventive concept is not limited thereto. For example, each of the stack-type memory devices 2100 may be implemented based on a GDDR, HMC, or Wide I/O standard. Each of the stack-type memory devices 2100 may correspond to the stack-type memory device 500 of FIG. 18 or the stack-type memory device 1100 of FIG. 19.

The system on chip 2200 may include at least one processor, such as a CPU, an AP, a GPU, or an NPU, and a plurality of memory controllers for controlling the plurality of stack-type memory devices 2100. The system on chip 2200 may exchange signals with the corresponding stack-type memory device through a memory controller. The system on chip 2200 may correspond to the system on chip 1200 of FIG. 19.

Figure 21:
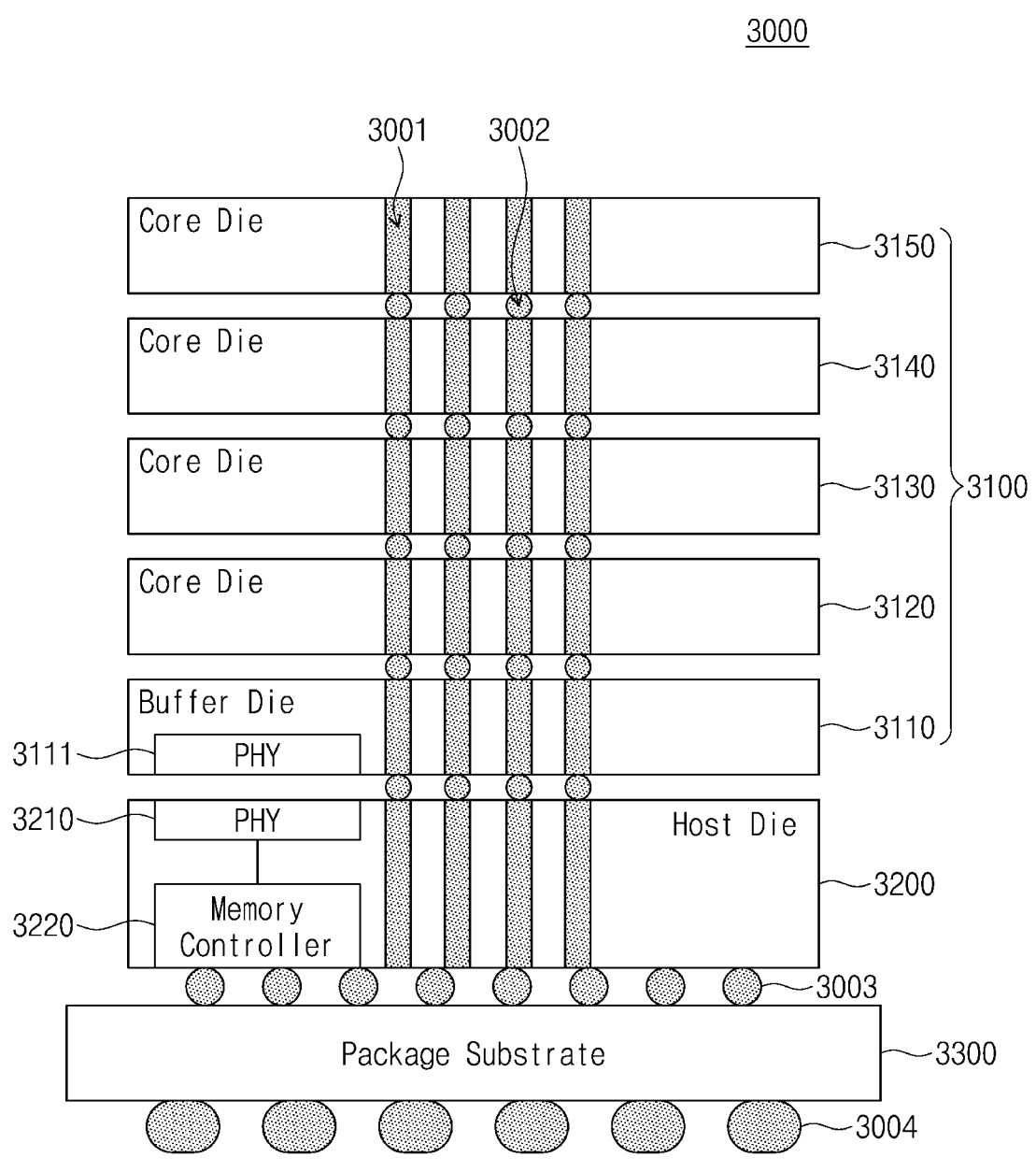
FIG. 21 is a diagram illustrating a semiconductor package according to an embodiment of the present disclosure.

FIG. 21 is a diagram illustrating a cross-sectional view of an exemplary semiconductor package according to an embodiment of the present disclosure. Referring to FIG. 21, a semiconductor package 3000 may include a stack-type memory device 3100, a host die 3200, and a package substrate 3300. The stack-type memory device 3100 may include a buffer die 3110 and core dies 3120 to 3150. The buffer die 3110 may include a physical layer 3111 for communicating with the host die 3200, and each of the core dies 3120 to 3150 may include a memory cell array. The stack-type memory device 3100 may correspond to the stack-type memory device 500 of FIG. 18

The host die 3200 may include a physical layer 3210 for communicating with the stack-type memory device 3100 and a memory controller 3220 for controlling overall operations of the stack-type memory device 3100. Also, the host die 3200 may include a processor that controls the overall operations of semiconductor package 3000 and executes an application that the semiconductor package 3000 supports. For example, the host die 3200 may include at least one processor such as a CPU, an AP, a GPU, or an NPU.

The stack-type memory device 3100 may be disposed on the host die 3200 based on TSVs 3001 so as to be vertically stacked on the host die 3200. As such, the buffer die 3110, the core dies 3120 to 3150, and the host die 3200 may be electrically connected through the TSVs 3001 and bumps 3002 without an interposer. For example, the bumps 3002 may be micro-bumps.

The bumps 3003 may be attached on an upper surface of the package substrate 3300, and solder balls 3004 may be attached on a lower surface of the package substrate 1400. For example, the bumps 3003 may be flip-chip bumps. The host die 3200 may be stacked on the package substrate 3300 through the bumps 3003. The semiconductor package 3000 may exchange signals with any other external package or semiconductor devices through the solder balls 3004.

In another embodiment, the stack-type memory device 3100 may be implemented only with the core dies 3120 to 3150 without the buffer die 3110. In this case, each of the core dies 3120 to 3150 may include interface circuits for communicating with the host die 3200. Each of the core dies 3120 to 3150 may exchange signals with the host die 3200 through the TSVs 3001.

Figure 22:
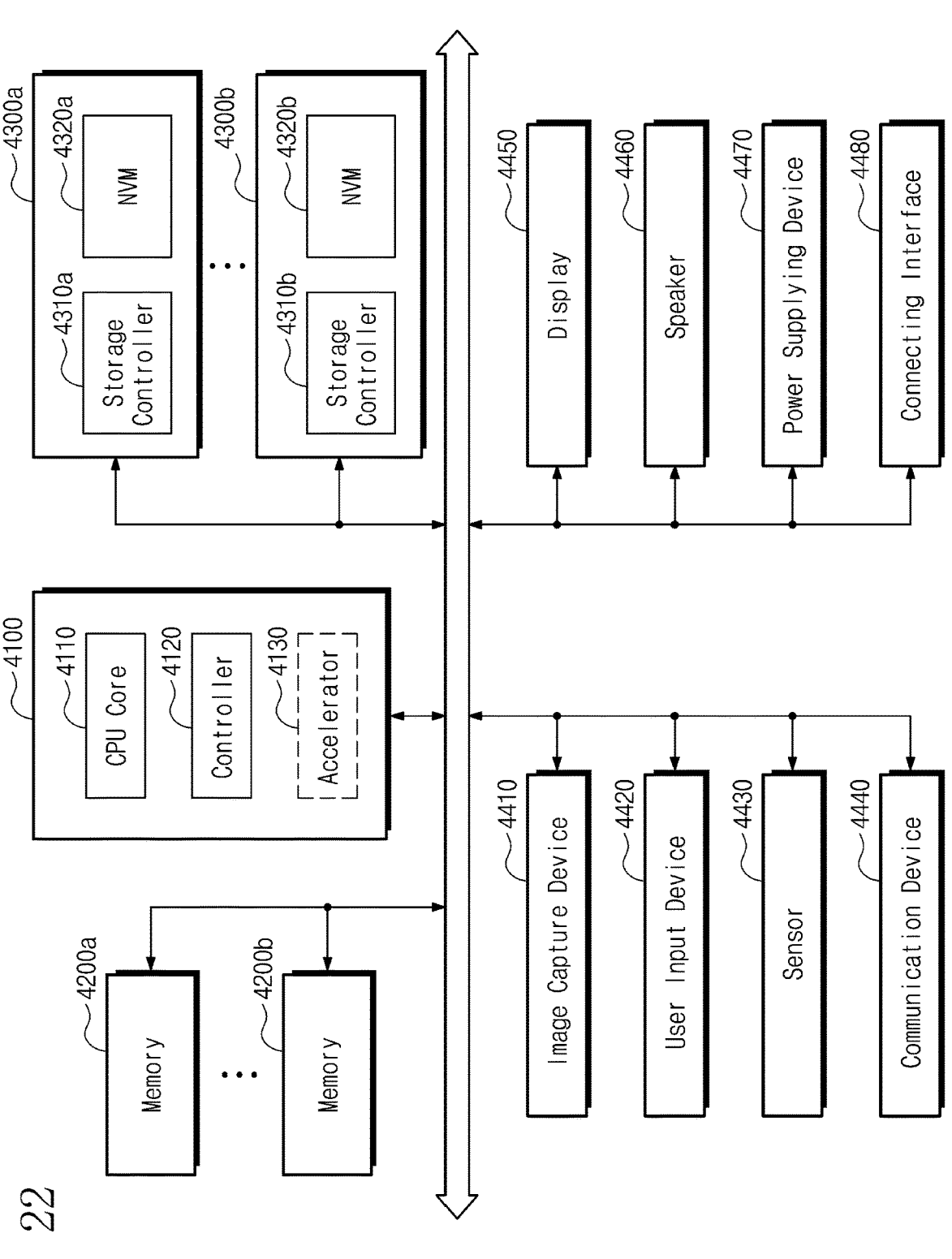
FIG. 22 is a diagram illustrating a system to which a memory device according to an embodiment of the present disclosure is applied.

FIG. 22 is a diagram of a system 4000 to which a storage device is applied, according to an embodiment.

Referring to FIG. 22, the system 4000 may include a main processor 4100, memories (e.g., 4200*a* and 4200*b*), and storage devices (e.g., 4300*a* and 4300*b*). In addition, the system 4000 may include at least one of an image capturing device 4410, a user input device 4420, a sensor 4430, a communication device 4440, a display 4450, a speaker 4460, a power supplying device 4470, and a connecting interface 4480.

The main processor 4100 may control all operations of the system 4000, more specifically, operations of other components included in the system 4000. The main processor 4100 may be implemented as a general-purpose processor, a dedicated processor, or an application processor.

The main processor 4100 may include at least one CPU core 4110 and further include a controller 4120 configured to control the memories 4200*a* and 4200*b* and/or the storage devices 4300*a* and 4300*b*. In some embodiments, the main processor 4100 may further include an accelerator 4130, which is a dedicated circuit for a high-speed data operation, such as an artificial intelligence (AI) data operation. The accelerator 4130 may include a graphics processing unit (GPU), a neural processing unit (NPU) and/or a data processing unit (DPU) and be implemented as a chip that is physically separate from the other components of the main processor 4100.

The memories 4200*a* and 4200*b* may be used as main memory devices of the system 4000. Each of the memories 1200*a* and 1200*b* may include a volatile memory, such as static random access memory (SRAM) and/or dynamic RAM (DRAM). In this case, the memories 4200*a* and 4200*b* may include the memory device described with reference to FIGS. 1 to 17. However, the present disclosure is not limited thereto. For example, the memories 4200*a* and 4200*b* may include a nonvolatile memory such as a PRAM and/or an RRAM. The memories 1200*a* and 1200*b* may be implemented in the same package as the main processor 1100.

The storage devices 4300*a* and 4300*b* may serve as non-volatile storage devices configured to store data regardless of whether power is supplied thereto, and have larger storage capacity than the memories 4200*a* and 4200*b*. The storage devices 4300*a* and 4300*b* may respectively include storage controllers (STRG CTRL) 4310*a* and 4310*b* and NVM (Non-Volatile Memory)s 4320*a* and 4320*b* configured to store data via the control of the storage controllers 4310*a* and 4310*b*. Although the NVMs 4320*a* and 4320*b* may include flash memories having a two-dimensional (2D) structure or a three-dimensional (3D) V-NAND structure, the NVMs 4320*a* and 4320*b* may include other types of NVMs, such as PRAM and/or RRAM.

The storage devices 4300*a* and 4300*b* may be physically separated from the main processor 4100 and included in the system 4000 or implemented in the same package as the main processor 4100. In addition, the storage devices 4300*a* and 4300*b* may have types of solid-state devices (SSDs) or memory cards and be removably combined with other components of the system 4000 through an interface, such as the connecting interface 4480 that will be described below. The storage devices 4300*a* and 4300*b* may be devices to which a standard protocol, such as a universal flash storage (UFS), an embedded multi-media card (eMMC), or a non-volatile memory express (NVMe), is applied, without being limited thereto.

The image capturing device 4410 may capture still images or moving images. The image capturing device 4410 may include a camera, a camcorder, and/or a webcam.

The user input device 4420 may receive various types of data input by a user of the system 4000 and include a touch pad, a keypad, a keyboard, a mouse, and/or a microphone.

The sensor 4430 may detect various types of physical quantities, which may be obtained from the outside of the system 4000, and convert the detected physical quantities into electric signals. The sensor 4430 may include a temperature sensor, a pressure sensor, an illuminance sensor, a position sensor, an acceleration sensor, a biosensor, and/or a gyroscope sensor.

The communication device 4440 may transmit and receive signals between other devices outside the system 4000 according to various communication protocols. The communication device 4440 may include an antenna, a transceiver, and/or a modem.

The display 4450 and the speaker 4460 may serve as output devices configured to respectively output visual information and auditory information to the user of the system 4000.

The power supplying device 4470 may appropriately convert power supplied from a battery (not shown) embedded in the system 4000 and/or an external power source, and supply the converted power to each of components of the system 4000.

The connecting interface 4480 may provide connection between the system 4000 and an external device, which is connected to the system 4000 and capable of transmitting and receiving data to and from the system 4000. The connecting interface 4480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

According to an embodiment of the present disclosure, a delay time measured in the interval oscillator training is corrected with reference to temperature information of a memory device such that an offset between the delay time measured in the FIFO training and the delay time measured in the interval oscillator training does not exceed a reference value. As a result, the reliability of the memory device may be improved.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

It will be appreciated that when an element is referred to herein as being "connected" or "coupled" to another element, it can be directly connected or coupled to the other element or intervening elements can be present. In contrast, when an element is referred to as being "directly connected" or "directly coupled" to another element, there are no intervening elements present.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An electronic device comprising:
a system on-chip configured to output a write clock and a write data signal; and
a memory device configured to receive the write data signal based on the write clock and to output a read data signal and a data strobe signal whose timing is different from a timing of the write clock,
wherein the memory device includes:
a first interval oscillator configured to replicate a difference between a path of the write clock and a path of the read data signal; and
a second interval oscillator configured to replicate a difference between the path of the write clock and a path of the write data signal,
wherein the system on-chip is configured to:
obtain a first delay time according to the difference between the path of the write clock and the path of the read data signal; and
obtain a second delay time according to the difference between the path of the write clock and the path of the write data signal, and
wherein the memory device is configured to:
obtain a first counting value while the first interval oscillator operates, the first counting value being indicative of the first delay time;
obtain a second counting value while the second interval oscillator operates, the second counting value being indicative of the second delay time;
correct the first counting value depending on a range in which a temperature of the memory device belongs to obtain a corrected first counting value; and
correct the second counting value depending on the range in which the temperature belongs to obtain a corrected second counting value.

2. The electronic device of claim 1, wherein, in initialization of the memory device, the system on-chip performs first training such that a delay of the write clock is adjusted based on the first delay time or such that a delay of the write data signal is adjusted based on the second delay time, and
wherein, in an operation of the memory device, the system on-chip performs second training such that the delay of the write clock is adjusted based on a third delay time corresponding to the corrected first counting value or such that the delay of the write data signal is adjusted based on a fourth delay time corresponding to the corrected second counting value.

3. The electronic device of claim 1, wherein the memory device is configured to:
obtain the first delay time in response to a FIFO (First In First Out) read command received from the system on-chip; and
obtain the second delay time in response to a FIFO write command received from the system on-chip.

4. The electronic device of claim 1, wherein the memory device is configured to obtain at least one of the first counting value and the second counting value in a time period between an interval oscillator start command and an interval oscillator stop command received from the system on-chip.

5. The electronic device of claim 1, wherein the memory device includes:
a first counter configured to output the first counting value;
a second counter configured to output the second counting value;
a temperature sensor configured to obtain information about the temperature of the memory device;
a control logic circuit configured to obtain the corrected first counting value by correcting the first counting value based on the information about the temperature and to obtain the corrected second counting value by correcting the second counting value based on the information about the temperature; and
a mode register configured to store the corrected first counting value and the corrected second counting value.

6. The electronic device of claim 5, wherein the memory device is configured to output the corrected first counting value and the corrected second counting value in response to a mode register read command received from the system on-chip.

7. The electronic device of claim 5, wherein the system on-chip includes:
a read data strobe signal receiver configured to receive a read data strobe signal;
a first delay circuit configured to control a delay of the read data strobe signal output from the read data strobe signal receiver based on the first counting value;
a second delay circuit configured to control a delay of the write data signal based on the second counting value; and
a data transmitter configured to transmit the write data signal output from the second delay circuit.

8. The electronic device of claim 1, wherein the first interval oscillator includes a first plurality of inverters, and the second interval oscillator includes a second plurality of inverters,
wherein the number of the first plurality of inverters is different from the number of the second plurality of inverters.

9. The electronic device of claim 2, wherein, when the second training is performed, the adjustment of the delay of the write clock based on the third delay time and the adjustment of the delay of the write data signal based on the fourth delay time are performed at different times.

10. The electronic device of claim 1, wherein the system on-chip and the memory device operate based on an LPDDR (Low Power Double Data Rate) standard.

* * * * *